(12) United States Patent
Luo et al.

(10) Patent No.: US 11,309,328 B2
(45) Date of Patent: Apr. 19, 2022

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Shuangqiang Luo, Boise, ID (US); Indra V. Chary, Boise, ID (US); Justin B. Dorhout, Boise, ID (US)

(73) Assignee: Micron Technology, Inc., Boise, ID (US)

(*) Notice: Subject to any disclaimer, the term of this patent is extended or adjusted under 35 U.S.C. 154(b) by 68 days.

(21) Appl. No.: 16/667,719

(22) Filed: Oct. 29, 2019

(65) Prior Publication Data
US 2021/0126010 A1  Apr. 29, 2021

(51) Int. Cl.
| | |
|---|---|
| *H01L 21/00* | (2006.01) |
| *H01L 27/11582* | (2017.01) |
| *H01L 27/11519* | (2017.01) |
| *H01L 27/11524* | (2017.01) |
| *G11C 16/08* | (2006.01) |
| *H01L 27/11565* | (2017.01) |

(Continued)

(52) U.S. Cl.
CPC ........ *H01L 27/11582* (2013.01); *G11C 16/08* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11582; H01L 27/11519; H01L 27/11524
See application file for complete search history.

(56) References Cited

U.S. PATENT DOCUMENTS

| | | |
|---|---|---|
| 8,624,300 B2 | 1/2014 | Tang et al. |
| 9,070,442 B2 | 6/2015 | Yip et al. |
| 9,589,978 B1 | 3/2017 | Yip |

(Continued)

OTHER PUBLICATIONS

International Search Report for Application No. PCT/US2020/050710, dated Dec. 29, 2020, 4 pages.

(Continued)

*Primary Examiner* — Laura M Menz
(74) *Attorney, Agent, or Firm* — TraskBritt

(57) ABSTRACT

A method of forming a microelectronic device comprises forming a microelectronic device structure. The microelectronic device structure comprises a stack structure comprising insulative structures and additional insulative structures vertically alternating with the insulative structures, a dielectric structure vertically extending partially through the stack structure, and a dielectric material vertically overlying and horizontally extending across the stack structure and the dielectric structure. Portions of at least the dielectric material and the dielectric structure are removed to form a trench vertically overlying and at least partially horizontally overlapping a remaining portion of the dielectric structure. The trench is substantially filled with additional dielectric material. Microelectronic devices, memory devices, and electronic systems are also described.

12 Claims, 14 Drawing Sheets

(51) Int. Cl.
*H01L 27/1157* (2017.01)
*H01L 27/11556* (2017.01)

(56) References Cited

U.S. PATENT DOCUMENTS

| | | | |
|---|---|---|---|
| 9,786,375 B2 | 10/2017 | Goda et al. | |
| 9,853,046 B2 | 12/2017 | Lu et al. | |
| 9,905,575 B2 | 2/2018 | Lee | |
| 9,941,209 B2 | 4/2018 | Tessariol et al. | |
| 10,074,430 B2 | 9/2018 | Sakui | |
| 10,074,665 B2 * | 9/2018 | Kawaguchi | H01L 27/11565 |
| 10,090,318 B2 | 10/2018 | Zhu et al. | |
| 10,229,923 B2 | 3/2019 | Dorhout et al. | |
| 10,256,249 B2 | 4/2019 | Douhout et al. | |
| 10,263,007 B2 | 4/2019 | Dorhout et al. | |
| 10,269,625 B1 | 4/2019 | Matovu et al. | |
| 10,283,520 B2 | 5/2019 | Hopkins et al. | |
| 10,347,654 B1 * | 7/2019 | Iwai | H01L 27/11519 |
| 10,615,172 B2 * | 4/2020 | Nagata | H01L 21/76895 |
| 10,658,381 B1 * | 5/2020 | Yu | H01L 27/1157 |
| 10,804,197 B1 * | 10/2020 | Kawasaki | H01L 27/11575 |
| 10,964,714 B2 * | 3/2021 | Lim | H01L 27/11573 |
| 2015/0162084 A1 | 6/2015 | Morooka et al. | |
| 2015/0263021 A1 | 9/2015 | Hwang et al. | |
| 2016/0104717 A1 | 4/2016 | Lu et al. | |
| 2017/0077108 A1 * | 3/2017 | Kawaguchi | H01L 27/11582 |
| 2018/0083021 A1 | 3/2018 | Sakamoto | |
| 2018/0301374 A1 | 10/2018 | Masamori et al. | |
| 2018/0308858 A1 | 10/2018 | Hopkins et al. | |
| 2018/0374868 A1 | 12/2018 | Choi | |
| 2019/0103406 A1 | 4/2019 | Tang et al. | |
| 2019/0348435 A1 * | 11/2019 | Nagata | H01L 27/11575 |
| 2020/0312765 A1 * | 10/2020 | Kawasaki | H01L 27/11565 |
| 2020/0357815 A1 * | 11/2020 | Iwai | H01L 21/76805 |
| 2021/0126010 A1 * | 4/2021 | Luo | H01L 27/11565 |

OTHER PUBLICATIONS

Written Opinion of the International Searching Authority for Application No. PCT/US2020/050710, dated Dec. 29, 2020, 4 pages.

* cited by examiner

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As vertical memory array technology has advanced, enhanced memory density has been provided by forming memory devices to exhibit multiple deck (e.g., dual deck) configurations. For example, in one conventional dual deck configuration, some vertical memory strings are located in an upper deck (e.g., an upper stack structure), and additional vertical memory strings are located in a lower deck (e.g., a lower stack structure) underlying the upper deck. The vertical memory strings of the upper deck may be electrically coupled to the additional vertical memory strings of the lower deck (e.g., by way of conductive interconnect structures), or the vertical memory strings of the upper deck may be electrically isolated from the additional vertical memory strings of the lower deck (e.g., by way of an intervening dielectric material). Unfortunately, as feature packing densities have increased and margins for formation errors have decreased, conventional memory device formation methods and associated configurations have resulted in undesirable stresses (e.g., access line contact over etch stresses), defects (e.g., access line contact punch through) and current leaks (e.g., select gate current leakage, access line current leakage) that can diminish desired memory device performance, reliability, and durability.

Accordingly, there remains a need for new methods of forming microelectronic devices facilitating enhanced memory density while alleviating the problems of conventional methods of forming microelectronic devices, as well as for new microelectronic device (e.g., memory device, such as 3D NAND Flash memory device) configurations and new electronic systems including the new microelectronic device configurations.

DETAILED DESCRIPTION

Figure 1A:
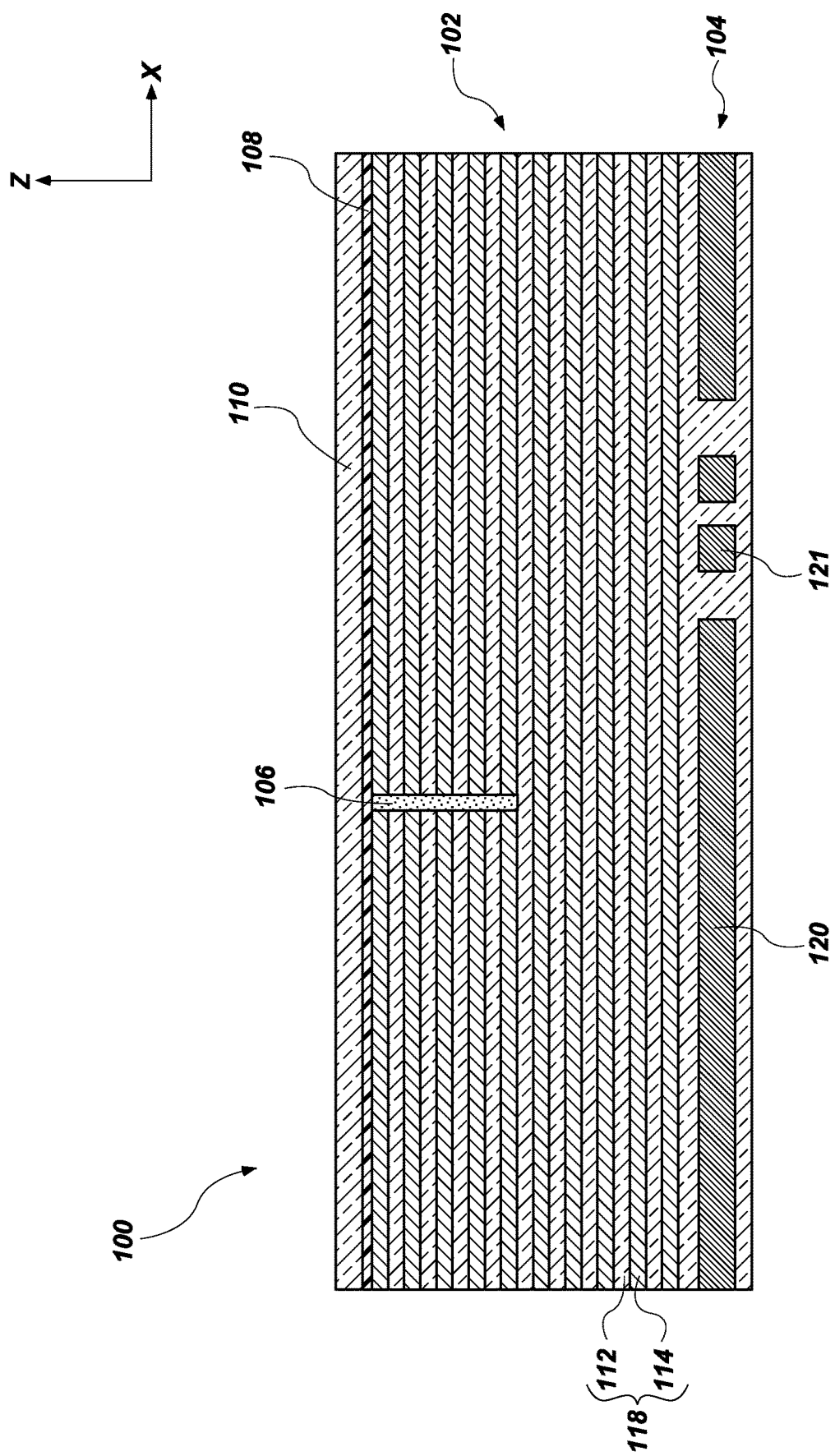
FIGS. 1A through 1H are a simplified, partial cross-sectional views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device including, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g. horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of at least one feature (e.g., at least one structure, at least one region, at least one apparatus) facilitating operation of the at least one feature in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIGS. 1A through 1H are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein may be used for and in various devices.

Referring to FIG. 1A, a microelectronic device structure 100 may be formed to include a stack structure 102, a source tier 104 under the stack structure 102, a dielectric structure 106 extending into the stack structure 102, a first dielectric material 108 on or over the stack structure 102 and the dielectric structure 106, and a second dielectric material 110 on or over the first dielectric material 108.

The stack structure 102 includes a vertically alternating (e.g., in the Z-direction) sequence of insulative structures 112 and additional insulative structures 114 arranged in tiers 118. Each of the tiers 118 of the stack structure 102 may include at least one of the insulative structures 112 vertically neighboring at least one of the additional insulative structures 114. The stack structure 102 may include a desired quantity of the tiers 118. For example, the stack structure 102 may include greater than or equal to ten (10) of the tiers 118, greater than or equal to twenty-five (25) of the tiers 118, greater than or equal to fifty (50) of the tiers 118, greater than or equal to one hundred (100) of the tiers 118, greater than or equal to one hundred and fifty (150) of the tiers 118, or greater than or equal to two hundred (200) of the tiers 118 of the insulative structures 112 and the additional insulative structures 114.

The insulative structures 112 of the tiers 118 of the stack structure 102 may be formed of and include at least one electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulative structures 112 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the insulative structures 112 are formed of and include $SiO_x$ (e.g., Sift). Each of the insulative structures 112 may individually include a substantially homogeneous distribution of the at least one electrically insulative material, or a substantially heterogeneous distribution of the at least one electrically insulative material. In some embodiments, each of the insulative structures 112 of each of the tiers 118 of the stack structure 102 exhibits a substantially homogeneous distribution of electrically insulative material. In additional embodiments, at least one of the insulative structures 112 of at least one of the tiers 118 of the stack structure 102 exhibits a substantially heterogeneous distribution of at least one electrically insulative material. The insulating structure 112 may, for example, be formed of and include a stack (e.g., laminate) of at least two different electrically insulative materials. The insulative structures 112 of each of the tiers 118 of the stack structure 102 may each be substantially planar, and may each individually exhibit a desired thickness.

The additional insulative structures 114 may be formed of and include at least one additional electrically insulative material that is selectively etchable relative to the electrically insulative material of the insulative structures 112. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. A material composition of the additional insulative structures 114 is different than a material composition of the insulative structures 112, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the additional insulative structures 114 are formed of and include $SiN_y$ (e.g., $Si_3N_4$). Each of the additional insulative structures 114 may individually include a substantially homogeneous distribution of the at least one additional electrically insulative material, or a substantially heterogeneous distribution of the at least one additional electrically insulative material. In some embodiments, each of the additional insulative structures 114 of each of the tiers 118 of the stack structure 102 exhibits a substantially homogeneous distribution of additional electrically insulative material. In additional embodiments, at least one of the additional insulative structures 114 of at least one of the tiers 118 of the stack structure 102 exhibits a substantially heterogeneous distribution of at least one additional electrically insulative material. The additional insulating structure 114 may, for example, be formed of and include a stack (e.g., laminate) of at least two different additional electrically insulative materials. The additional insulative structures 114 of each of the tiers 118 of the stack structure 102 may each be substantially planar, and may each individually exhibit a desired thickness.

The source tier 104 vertically underlies (e.g., in the Z-direction) the stack structure 102 and includes at least one source structure 120 (e.g., a source plate) and discrete conductive structures 121 (e.g., discrete conductive island structures) horizontally separated from the source structure 120 and from one another. The source structure 120 and the discrete conductive structures 121 may be located at substantially the same vertical position (e.g., in the Z-direction) within the microelectronic device structure 100 as one another. At least one dielectric material may be horizontally interposed between the discrete conductive structures 121 and may also be horizontally interposed between the discrete conductive structures 121 and the source structure 120. Put another way, the dielectric material may horizontally intervene between and separate horizontally neighboring discrete conductive structures 121 of the source tier 104, and may also horizontally intervene between and separate the source structure 120 and the discrete conductive structures 121 of the source tier 104.

The source structure 120 and the discrete conductive structures 121 may each individually be formed of and include at least one electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), and a conductive metal-containing material (e.g., a conductive metal nitride, a conductive metal silicide, a conductive metal carbide, a conductive metal oxide). In some embodiments, the source structure 120 and the discrete conductive structures 121 have substantially the same material composition as one another. Put another way, the source structure 120 and the discrete conductive structures 121 may be formed of and include the same electrically conductive material as one another. For example, the source structure 120 and the discrete conductive structures 121 may be formed (e.g., substantially simultaneously formed) by patterning (e.g., using a predetermined reticle configuration) the electrically conductive material.

With continued reference to FIG. 1A, the dielectric structure 106 may partially vertically extend (e.g., in the Z-direction) into the stack structure 102. The dielectric structure 106 may serve as a partial barrier during and after the subsequent formation of select gate structures (e.g., upper select gate structures, such drain side select gate(s) (SGDs)) through subsequent processing (e.g., so called "replace gate" or "gate last" processing) of the microelectronic device structure 100, as described in further detail below. The dielectric structure 106 may substantially fill a slot (e.g., trench, slit, opening) vertically extending through some (e.g., two or more) upper tiers 118 of the stack structure 102. As shown in FIG. 1A, an upper surface of the dielectric structure 106 may be formed to be substantially coplanar with an uppermost surface of the stack structure 102 (e.g., an uppermost surface of an uppermost additional insulating structure 114 of an uppermost tier 118 of the stack structure 102).

The dielectric structure 106 may be formed of and include at least one dielectric material. The additional electrically insulative material of the additional insulative structures 114 of the stack structure 102 may be selectively etchable relative to the dielectric material of the dielectric structure 106. A material composition of the dielectric structure 106 is different than a material composition of the additional insulative structures 114, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric structure 106 is formed of and includes $AlO_x$ (e.g., $Al_2O_3$). The dielectric structure 106 may include a substantially homogeneous distribution of the dielectric material, or a substantially heterogeneous distribution of the dielectric material. In some embodiments, the dielectric structure 106 exhibits a substantially homogeneous distribution of dielectric material. In additional embodiments, the dielectric structure 106 exhibits a substantially heterogeneous distribution of dielectric material. The dielectric structure 106 may, for example, be formed of and include a stack (e.g., laminate) of at least two different dielectric materials.

The first dielectric material 108 is formed on or over an uppermost tier 118 of the stack structure 102 and on or over the dielectric structure 106 vertically extending into the stack structure 102. The first dielectric material 108 may be employed to alleviate (e.g., mitigate, reduce) stresses (e.g., over etch stresses) imparted on the stack structure 102 during subsequent processing (e.g., etching, such as contact opening etching) of the microelectronic device structure 100. In some embodiments, the first dielectric material 108 is formed to extend substantially continuously on and across uppermost surfaces of the stack structure 102 and the dielectric structure 106. The combination of the first dielectric material 108 and the stack structure 102 may substantially surround the dielectric structure 106.

The first dielectric material 108 may be formed of and include at least one dielectric material that is selectively etchable relative to the electrically insulative material of the insulative structures 112 of the stack structure 102 and the dielectric material of the dielectric structure 106. A material composition of the first dielectric material 108 is different than material compositions of the insulative structures 112 and the dielectric structure 106, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the first dielectric material 108 comprises a dielectric nitride material. The material composition of the first dielectric material 108 may be substantially the same as a material composition of the additional insulative structures 114, or may be different than the material composition of the additional insulative structures 114. The first dielectric material 108 may be substantially homogeneous, or may be substantially heterogeneous. In some embodiments, the first dielectric material 108 is substantially homogeneous. In additional embodiments, the first dielectric material 108 is substantially heterogeneous. The first dielectric material 108 may be substantially planar, and may exhibit a desired thickness.

With continued reference to FIG. 1A, the second dielectric material 110 may be formed on or over a surface of the first dielectric material 108. In some embodiments, the second dielectric material 110 is formed to extend substantially continuously on and across an uppermost surface of the first dielectric material 108.

The second dielectric material 110 may be formed of and include at least one dielectric material. The materials of the first dielectric material 108 and the additional insulative structures 114 of the stack structure 102 may be selectively etchable relative to the second dielectric material 110. A material composition of the second dielectric material 110 is different than material compositions of the first dielectric material 108 and the additional insulative structures 114, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the second dielectric material 110 is formed of and includes $SiO_x$ (e.g., Sift). The second dielectric material 110 may be substantially homogeneous, or may be substantially heterogeneous. In some embodiments, the second dielectric material 110 is substantially homogeneous. In additional embodiments, the second dielectric material 110 is substantially heterogeneous. The second dielectric material 110 may be substantially planar, and may exhibit a desired thickness.

The stack structure 102 (including the tiers 118 thereof), the source tier 104, and the dielectric structure 106, the first dielectric material 108, and the second dielectric material 110 may be formed using conventional processes (e.g., conventional material deposition processes, conventional photolithography processes, conventional material removal processes) and conventional processing equipment, which are not described in detail herein.

Figure 1B:
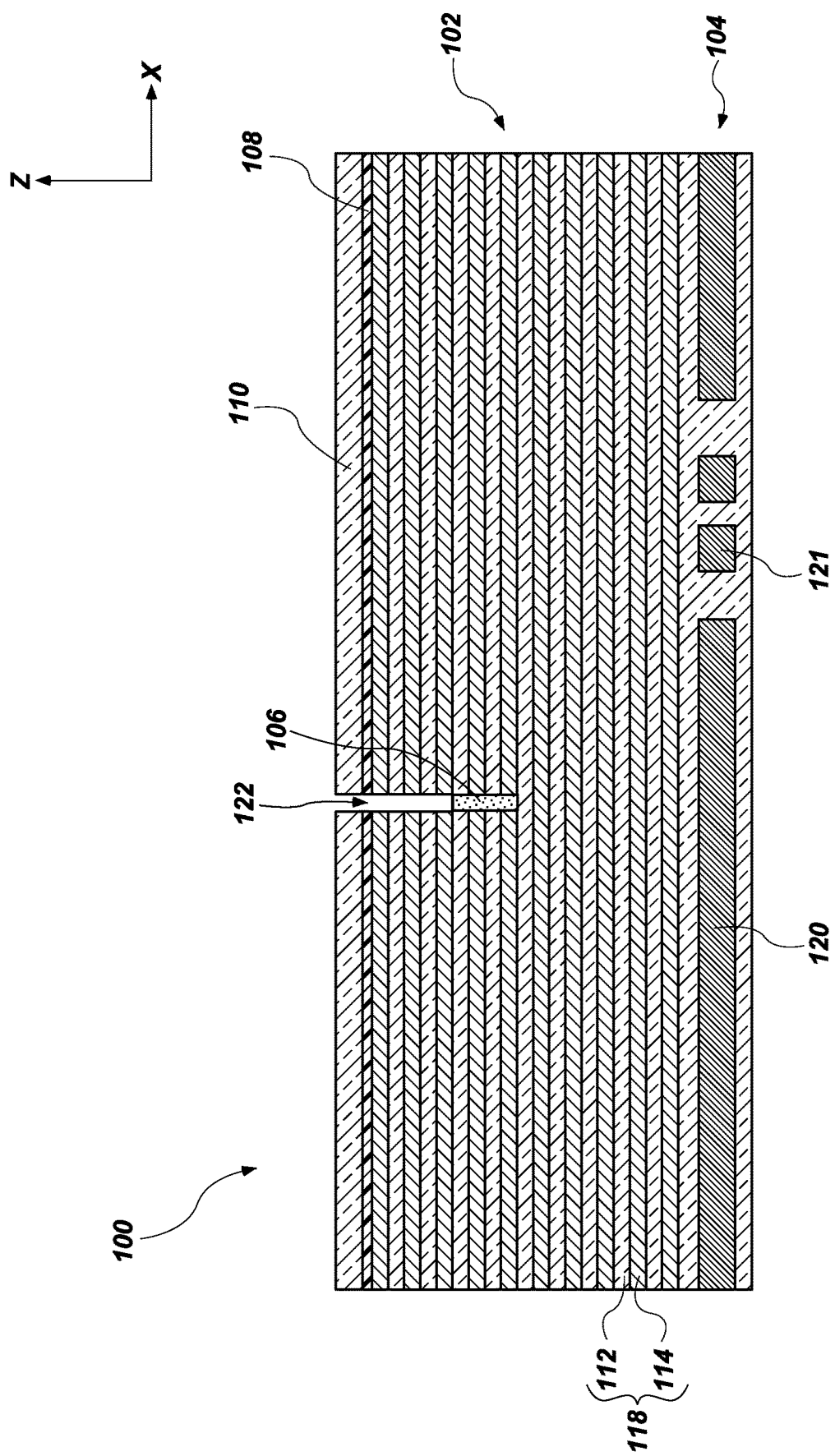

Referring next to FIG. 1B, portions of the second dielectric material 110, the first dielectric material 108, the dielectric structure 106, and the stack structure 102 may be removed to form a trench 122 (e.g., slot, slit, opening). The trench 122 may vertically extend (e.g., in the Z-direction) through the second dielectric material 110, the first dielectric material 108, and one or more (e.g., two or more) of upper tiers 118 of the stack structure 102 to an upper surface of a remaining (e.g., unremoved) portion of the dielectric structure 106. The trench 122 may disrupt (e.g., terminate) the horizontal continuity of the first dielectric material 108 and the second dielectric material 110, and may expose an upper surface of the remaining portion of the dielectric structure 106. In additional embodiments, the trench 122 vertically extends through the second dielectric material 110 and the first dielectric material 108 to an upper surface of a remaining portion of the dielectric structure 106, but does not vertically extend completely through an uppermost tier 118 of the stack structure 102. For example, a bottom of the trench 122 may be located above a lower vertical boundary of the uppermost tier 118 of the stack structure 102. In further embodiments, the trench 122 vertically extends through an entirety of the dielectric structure 106. For example, a bottom of the trench 122 may be located at or below a lower vertical boundary of the dielectric structure 106. The trench 122 may be at least partially horizontally aligned (e.g., in the X-direction) with the dielectric structure 106. For example, as shown in FIG. 1A, a horizontal centerline of the trench 122 may be substantially horizontally aligned with a horizontal centerline of the dielectric structure 106.

The trench 122 may be formed to exhibit a desired horizontal cross-sectional shape and desired horizontal dimensions (e.g., width, length). In some embodiments, the trench 122 is formed to exhibit an oblong horizontal cross-sectional shape (e.g., a rectangular cross-sectional shape). A horizontal dimension (e.g., width) of the trench 122 in a first horizontal direction (e.g., the X-direction) may be less than another horizontal dimension (e.g., length) of the trench 122 is a second horizontal direction (e.g., a direction orthogonal to the X-direction). The trench 122 may substantially (e.g., completely) horizontally partition (e.g., substantially horizontally divide) the first dielectric material 108 and the second dielectric material 110 at and along the dielectric structure 106. In some embodiments, a width (e.g., in the X-direction) of the trench 122 is formed to be greater than a width (e.g., in the X-direction) of the dielectric structure 106. The width of the trench 122 may, for example, be within a range of from about 1 percent greater about 20 percent greater (e.g., from about 5 percent greater to about 15 percent greater) than the width of the dielectric structure 106. In additional embodiments, the width of the trench 122 is formed to be less than or equal to the width of the dielectric structure 106.

The trench 122 may be formed using conventional processes, such as conventional material removal processes (e.g., conventional etching processes, such as conventional dry etching processes) and conventional processing equipment, which are not described in detail herein. By way of non-limiting example, the second dielectric material 110, the first dielectric material 108, the dielectric structure 106, and the stack structure 102 may be subjected to anisotropic etching (e.g., anisotropic dry etching, such as one or more of reactive ion etching (RIE), deep RIE, plasma etching, reactive ion beam etching, and chemically assisted ion beam etching) to selectively remove portions thereof and form the trench 122.

Figure 1C:
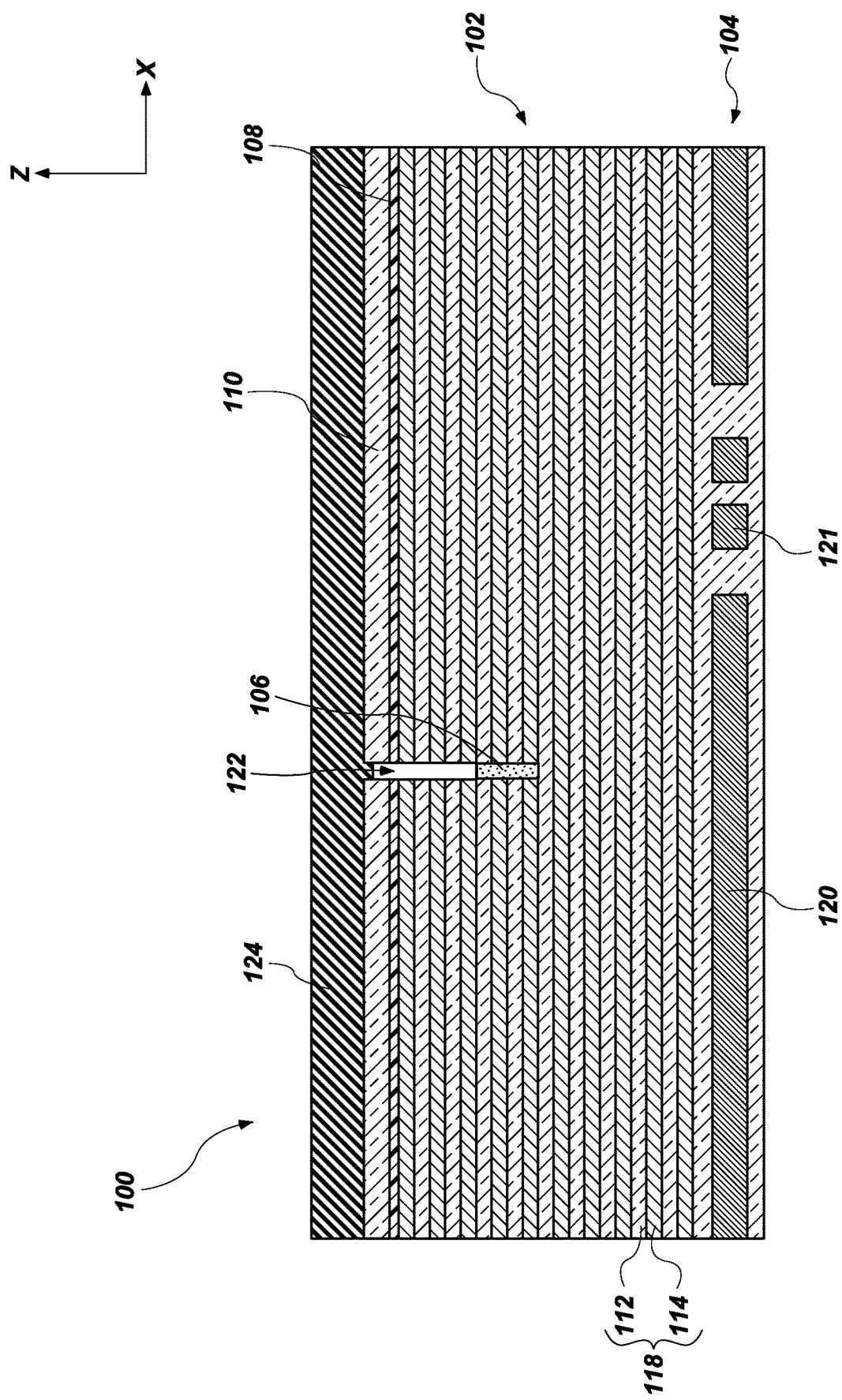

Referring next to FIG. 1C, a masking structure 124 may be formed (e.g., non-conformally formed) over exposed surfaces of the microelectronic device structure 100. The masking structure 124 may be formed on or over surfaces of the microelectronic device structure 100 outside of the trench 122 without substantially filling the trench 122 with material of the masking structure 124. As shown in FIG. 1C, material of the masking structure 124 may partially vertically extend into the trench 122, but at least a majority (e.g., greater than 50 percent, such as greater than or equal to about 60 percent, greater than or equal to about 70 percent, greater than or equal to about 80 percent, or greater than or equal to about 90 percent) of a volume of the trench 122 may remain unfilled with the material of the masking structure 124. For example, material of the masking structure 124 may vertically extend below an upper vertical boundary (e.g., an upper surface) of the second dielectric material 110, but may terminate above an upper vertical boundary (e.g., an upper surface) of the first dielectric material 108.

The masking structure 124 may be formed of and include at least one material (e.g., at least one hard mask material) suitable for use as an etch mask to pattern portions of the second dielectric material 110, the first dielectric material 108, the dielectric structure 106, and the stack structure 102 (e.g., portions of the tiers 118, including portions of the insulative structures 112 and portions of the additional insulative structures 114) to form openings (e.g., apertures, vias) vertically extending (e.g., in the Z-direction) to the source tier 104, as described in further detail below. By way of non-limiting example, the masking structure 124 may be formed of and include one or more hard mask materials having etch selectivity relative to the materials of second dielectric material 110, the first dielectric material 108, the dielectric structure 106, and the stack structure 102. In some embodiments, the masking structure 124 comprises one or more of amorphous carbon and doped amorphous carbon (e.g., boron-doped amorphous carbon, such as boron-doped amorphous carbon comprising at least 1 weight percent (wt %) boron and at least 20 wt % carbon, such as between about 1 wt % boron and about 40 wt % boron, and between about 99 wt % carbon and about 60 wt % carbon).

The masking structure 124 may formed using conventional processes including, but not limited to, physical vapor deposition ("PVD"), chemical vapor deposition ("CVD"), atomic layer deposition ("ALD"), and/or spin-coating. PVD includes, but is not limited to, one or more of sputtering, evaporation, and ionized PVD. Such processes are known in the art and, therefore, are not described in detail herein.

Figure 1D:
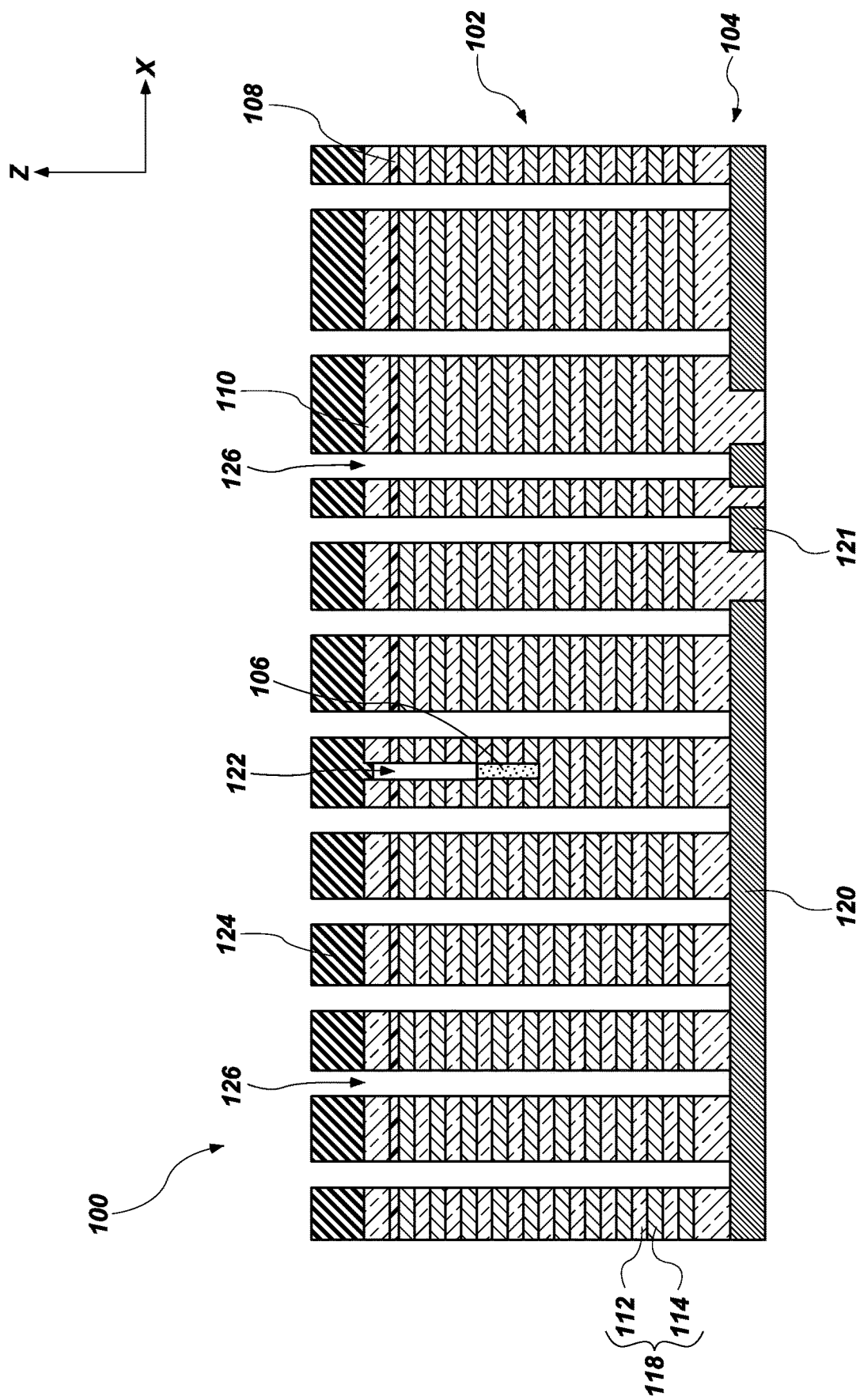

Referring next to FIG. 1D, portions of the masking structure 124, the second dielectric material 110, the first dielectric material 108, the dielectric structure 106, and the stack structure 102 are removed (e.g., etched) to form contact openings 126 (e.g., apertures, vias) vertically extending (e.g., in the Z-direction) therethrough. The contact openings 126 may vertically extend to the source tier 104. Bottoms of the contact openings 126 may expose and be defined by upper surfaces of structures (e.g., the source structure 120, the discrete conductive structures 121) of the source tier 104. As shown in FIG. 1D, the trench 122 may be substantially covered by other portions of the masking structure 124 remaining (e.g., maintained) following the material removal process.

The microelectronic device structure 100 at the processing stage depicted in FIG. 1D may be formed to exhibit any desired quantities, geometric configurations, horizontal positions, and horizontal spacing of the contact openings 126. The quantities, geometric configurations, horizontal positions, and horizontal spacing of the contact openings 126 may at least partially depend on the configurations of the source tier 104 (including the configurations of the source structure 120 and the discrete conductive structures 121 thereof) and the stack structure 102 (including the configurations of the insulative structures 112 and the additional insulative structures 114 thereof), as well as predetermined functions (e.g., support functions, electrical connection functions) of structures (e.g., electrically conductive structures) to subsequently be formed in the contact openings 126, as described in further detail below. In some embodiments, at least some of the contact openings 126 are sized, shaped, positioned, and spaced to facilitate the subsequent formation of pillar structures configured to provide structural support to the stack structure 102 and the first dielectric material 108 during so called "replace gate" or "gate last" processing acts that at least partially replace materials of the additional insulative structures 114 and the first dielectric material 108 with one or more electrically conductive materials, as described in further detail below. At least some of the contact openings 126 may, for example, exhibit non-circular horizontal cross-sectional shapes (e.g., oblong cross-sectional shapes, such as ovular cross-sectional shapes) and/or non-uniform (e.g., varied) spacing. As shown in FIG. 1D, the some of the contact openings 126 are formed to land on the source structure 120 of the source tier 104, and other of the contact openings 126 are formed to land on the discrete conductive structures 121 of the source tier 104. Each of the contact openings 126 landing on the discrete conductive structures 121 of the source tier 104 may be formed to be substantially horizontally centered about horizontal centers of the discrete conductive structures 121, or at least some of the contact openings 126 landing on the discrete conductive structures 121 may individually be formed to be horizontally offset from horizontal centers of the discrete conductive structures 121 associated therewith (e.g., uncovered thereby).

The contact openings 126 may be formed using conventional processes, such as conventional material removal processes (e.g., conventional etching processes, such as conventional dry etching processes) and conventional processing equipment, which are not described in detail herein. By way of non-limiting example, the masking structure 124, the second dielectric material 110, the first dielectric material 108, the dielectric structure 106, and the stack structure 102 may be subjected to anisotropic etching (e.g., anisotropic dry etching, such as one or more of RIE, deep RIE, plasma etching, reactive ion beam etching, and chemically assisted ion beam etching) to selectively remove portions thereof and form the contact openings 126.

Figure 1E:
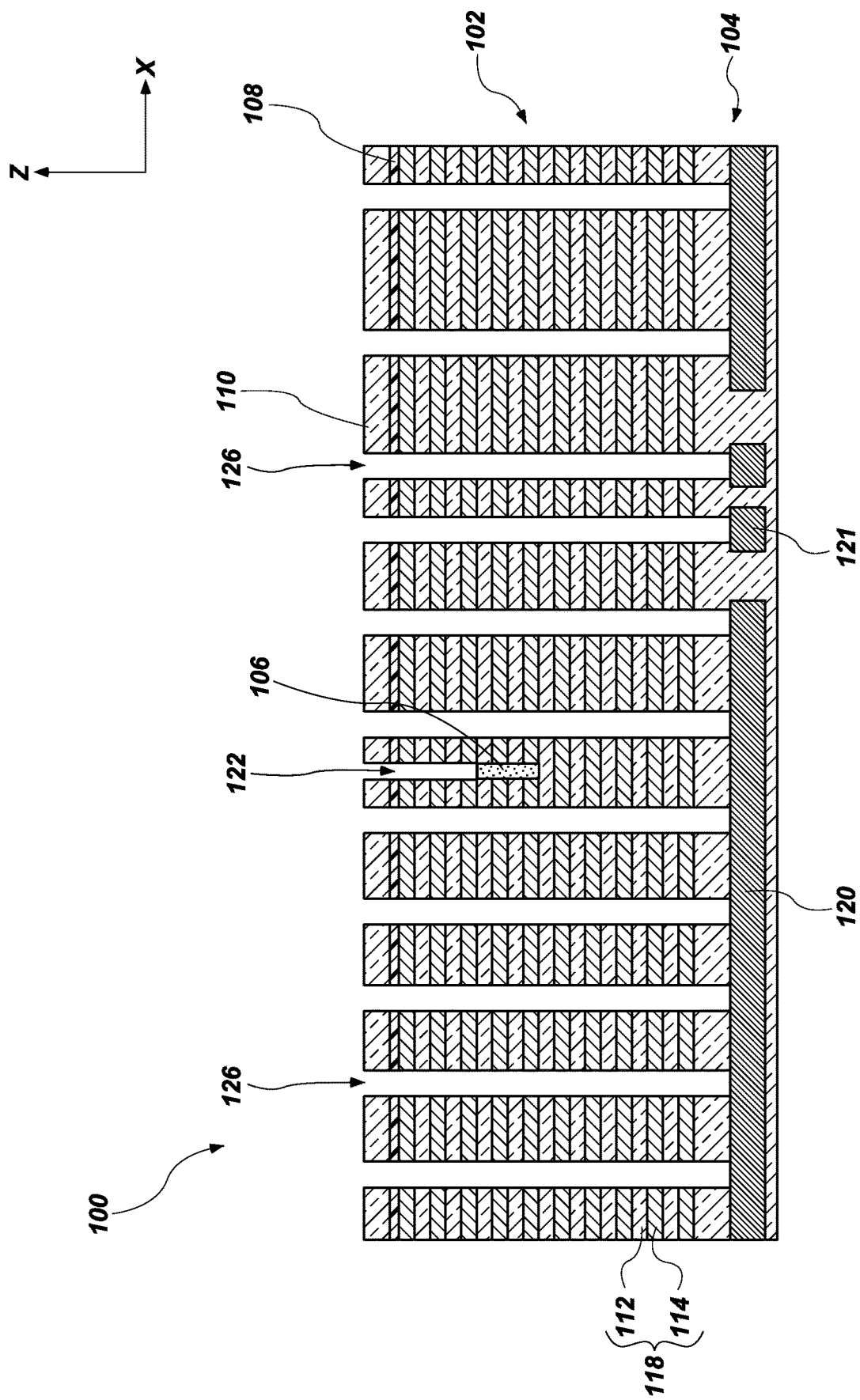

Referring next to FIG. 1E, remaining portions of the masking structure 124 (FIG. 1D) may be selectively removed. As shown in FIG. 1E, the selective removal of the remaining portions of the masking structure 124 may re-open (e.g., uncover, expose) the trench 122. The remaining portions of the masking structure 124 may be removed using conventional processes and conventional processing equipment, which are not described in detail herein. As a non-limiting example, the remaining portions of the masking structure 124 may be removed using at least one conventional chemical-mechanical planarization (CMP) process.

Figure 1F:
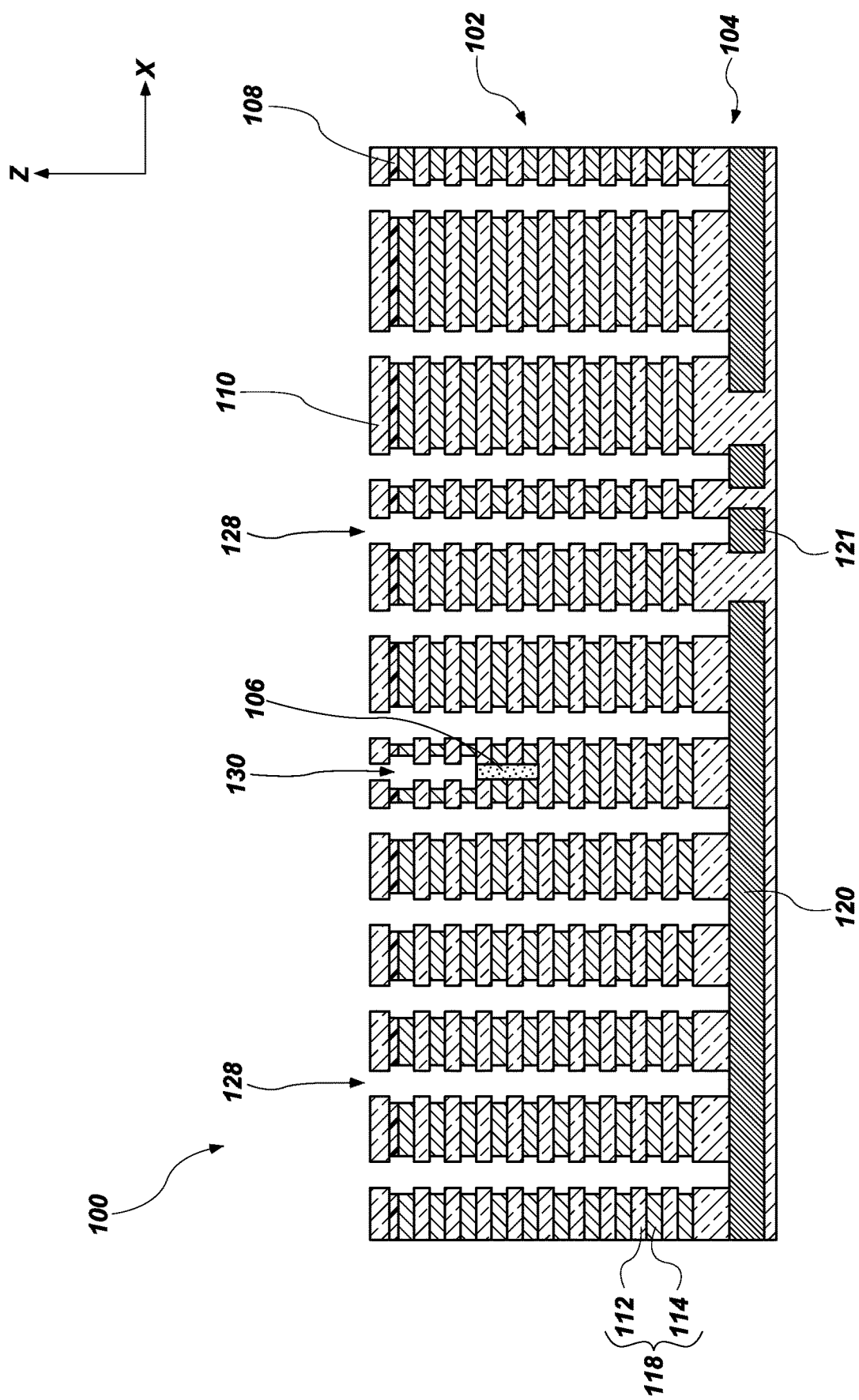

Referring next to FIG. 1F, portions of the first dielectric material 108 and the additional insulative structures 114 of the stack structure 102 may be selectively removed relative to the second dielectric material 110 and the insulative structures 112 of the stack structure 102. The material removal process may horizontally recess portions of the first dielectric material 108 and the additional insulative structures 114 of the stack structure 102 exposed within the contact openings 126 (FIG. 1E) and the trench 122 (FIG. 1E) to form enlarged contact openings 128 and an enlarged trench 130. The enlarged contact openings 128 and the enlarged trench 130 may each exhibit non-planar horizontal boundaries effectuated by the horizontally recessing of the first dielectric material 108 and the additional insulative structures 114 relative to the second dielectric material 110 and the insulative structures 112.

The enlarged contact openings 128 and the enlarged trench 130 may be formed by subjecting the microelectronic device structure 100 at the processing stage depicted in FIG. 1E to at least one etching processing (e.g., an isotropic etching process) employing an etch chemistry in which the materials (e.g., dielectric nitride materials) of the additional insulating structures 114 and the first dielectric material 108 are selectively removed relative to the materials (e.g., dielectric oxide materials) of the second dielectric material 110, insulative structures 112, and the dielectric structure 106. By way of non-limiting example, if the second dielectric material 110, insulative structures 112, and the dielectric structure 106 are formed of and include one or more dielectric oxide materials (e.g., $SiO_x$, $AlO_x$), and the first dielectric material 108 and the additional insulative structures 114 are formed of and include one or more dielectric nitride materials (e.g., $SiN_y$), the microelectronic device structure 100 may be exposed to an etchant comprising phosphoric acid ($H_3O_4P$) to selectively remove portions of the first dielectric material 108 and the additional insulative structures 114 exposed within the contact openings 126 (FIG. 1E) and the trench 122 (FIG. 1E).

Figure 1G:
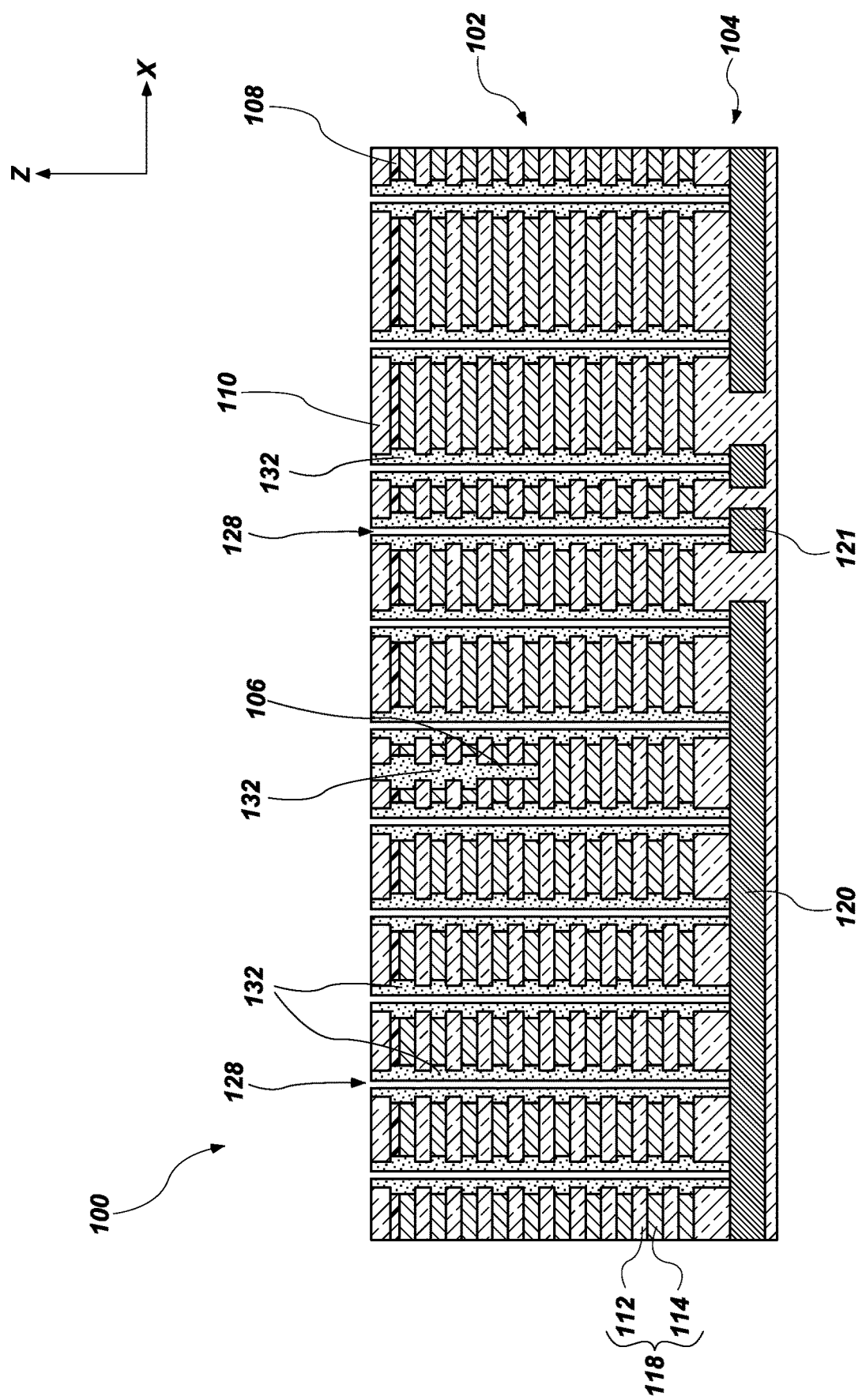

Referring next to FIG. 1G, a dielectric liner material 132 may be formed within the enlarged contact openings 128 and the enlarged trench 130 (FIG. 1F). As shown in FIG. 1G, the dielectric liner material 132 may partially (e.g., less than completely) fill the enlarged contact openings 128 and may substantially (e.g., completely) fill the enlarged trench 130 (FIG. 1F). The dielectric liner material 132 may cover and substantially extend across surfaces defining horizontal boundaries (e.g., sides) and lower vertical boundaries (e.g., bottoms, floors) of the enlarged contact openings 128 without substantially filling horizontally central portions of the enlarged contact openings 128. In addition, the dielectric liner material 132 may cover and substantially extend across surfaces defining horizontal boundaries and lower vertical boundaries of the enlarged trench 130 (FIG. 1F) and may also substantially fill a horizontally central portion of the enlarged trench 130 (FIG. 1F).

The dielectric liner material 132 may be formed of and include at least one dielectric material. The materials of first dielectric material 108 and the additional insulative structures 114 of the stack structure 102 may be selectively etchable relative to the dielectric liner material 132. A material composition of the dielectric liner material 132 is different than material compositions of the first dielectric material 108 and the additional insulative structures 114, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric liner material 132 is formed of and includes $AlO_x$ (e.g., $Al_2O_3$). The dielectric liner material 132 may include a substantially homogeneous distribution of the dielectric material, or a substantially heterogeneous distribution of the dielectric material. In some embodiments, the dielectric liner material 132 exhibits a substantially homogeneous distribution of dielectric material. In additional embodiments, the dielectric liner material 132 exhibits a substantially heterogeneous distribution of dielectric material. The dielectric liner material 132 may, for example, be formed of and include a stack (e.g., laminate) of at least two different dielectric materials.

The dielectric liner material 132 may be formed using conventional processes (e.g., conventional deposition processes, such as one or more of a conformal CVD process and an ALD process) and conventional processing equipment, which are not described in detail herein.

Figure 1H:
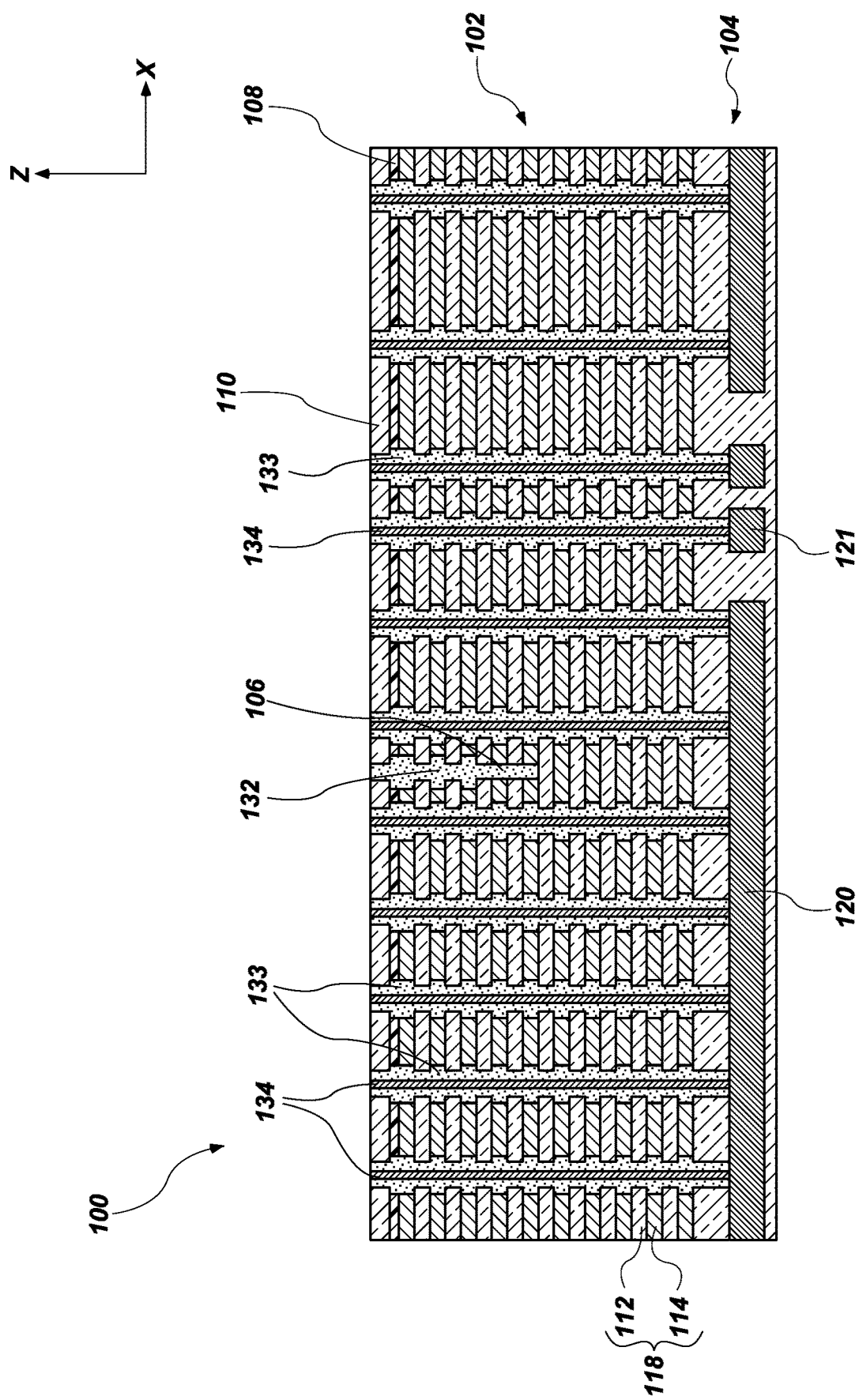

Referring next to FIG. 1H, portions of the dielectric liner material 132 at lower vertical boundaries (e.g., bottoms) of the enlarged contact openings 128 (FIG. 1G) may be removed (e.g., punched through) to form dielectric liner structures 133, and then contact structures 134 (e.g., pillar structures) may be formed within remaining portions (e.g., portions not occupied by the dielectric liner structures 133) of the enlarged contact openings 128 (FIG. 1G). The contact structures 134 may substantially fill the remaining portions of the enlarged contact openings 128 and may contact (e.g., physically contact, electrically contact) structures (e.g., the source structure 120, the discrete conductive structures 121) of the source tier 104. The dielectric liner structures 133 may horizontally intervene between the contact structures 134 and each of the second dielectric material 110, the first dielectric material 108, and the stack structure 102 (including the insulative structures 112 and the additional insulative structures 114 thereof).

The contact structures 134 may each individually be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the contact structures 134 are formed of and include W. Each of the contact structures 134 may individually include a substantially homogeneous distribution of the at least one electrically conductive material, or a substantially heterogeneous distribution of the at least one electrically conductive material. In some embodiments, each of contact structures 134 exhibits a substantially homogeneous distribution of electrically conductive material. In additional embodiments, at least one of the contact structures 134 exhibits a substantially heterogeneous distribution of at least one electrically conductive material.

Some of the contact structures 134 are sized, shaped, positioned, and spaced to provide structural support to the stack structure 102 and the first dielectric material 108 during subsequent "replace gate" or "gate last" processing acts performed on the microelectronic device structure 100. Other of the contact structures 134 are sized, shaped, positioned, and spaced to electrically connect (e.g., electrically couple) one or more features (e.g., the source structure 120, some of the discrete conductive structures 121) of the microelectronic device structure 100 with one or more additional features (e.g., one or more features of a larger microelectronic device). At least some of the contact structures 134 may, for example, exhibit non-circular horizontal cross-sectional shapes (e.g., oblong horizontal cross-sectional shapes, such as ovular horizontal cross-sectional shapes) and/or non-uniform (e.g., varied) horizontal spacing. The sizes, shapes, positions, and spacing of the contact structures 134 may be complementary to the sizes, shapes, positions, and spacing of the enlarged contact openings 128 (FIG. 1G). As shown in FIG. 1H, the some of the contact structures 134 are formed to land on the source structure 120 of the source tier 104, and other of the contact structures 134 are formed to land on the discrete conductive structures 121 of the source tier 104. Each of the contact structures 134 landing on the discrete conductive structures 121 of the source tier 104 may be formed to be substantially horizontally centered about horizontal centers of the discrete conductive structures 121, or at least some of the contact structures 134 landing on the discrete conductive structures 121 may individually be formed to be horizontally offset from horizontal centers of the discrete conductive structures 121 associated therewith.

The contact structures 134 may be formed through conventional processes (e.g., conventional material deposition processes, conventional material removal processes), which are not described in detail herein. By way of non-limiting example, openings (e.g., vias, apertures) may be formed through the dielectric liner material 132 (FIG. 1G) at the lower vertical boundaries of the enlarged contact openings 128 (FIG. 1G) to expose positions of the source structure 120 and the discrete conductive structures 121 of the source tier 104, and then portions (e.g., volumes, open spaces) of the enlarged contact openings 128 not occupied by the dielectric liner structures 133 formed form the dielectric liner material 132 (FIG. 1G may be filled with at least one electrically conductive material to form the contact structures 134). Portions of the electrically conductive material outside of the boundaries (e.g., horizontal boundaries, vertical boundaries) of the enlarged contact openings 128, if any, may be removed through conventional processes (e.g., at least one conventional CMP process).

Thus, in accordance with embodiments of the disclosure, a method of forming a microelectronic device comprises forming a microelectronic device structure. The microelectronic device structure comprises a stack structure comprising insulative structures and additional insulative structures vertically alternating with the insulative structures, a dielectric structure vertically extending partially through the stack structure, and a dielectric material vertically overlying and horizontally extending across the stack structure and the dielectric structure. Portions of at least the dielectric material and the dielectric structure are removed to form a trench vertically overlying and at least partially horizontally overlapping a remaining portion of the dielectric structure. The trench is substantially filled with additional dielectric material.

Following the formation of the contact structures 134, the microelectronic device structure 100 may be subjected to additional processing. For example, slots (e.g., slits, trenches) may be formed to vertically extend through the second dielectric material 110, the first dielectric material 108, and the stack structure 102 to form discrete blocks. Thereafter, portions of the first dielectric material 108 and the additional insulative structures 114 of the stack structure 102 may be selectively removed (e.g., selectively etched and exhumed) through the slots, and replaced with conductive structures each individually comprising at least one electrically conductive material (e.g., at least one metal, such as W) through a so-called "replace gate" or "gate last" process. Some of the conductive structures may function as access line structures (e.g., word line structures) for the microelectronic device structure 100, and other of the conductive structures may function as select gate structures for the microelectronic device structure 100. At least one lower conductive structure of the resulting modified stack structure may be employed as at least one lower select gate (e.g., at least one source side select gate (SGS)) of the microelectronic device structure 100. In some embodiments, a single (e.g., only one) conductive structure of a vertically lowermost tier of the modified stack structure is employed as a lower select gate (e.g., a SGS) of the microelectronic device structure 100. In addition, upper conductive structures of the modified stack structure may be employed as upper select gates (e.g., drain side select gates (SGDs)) of the microelectronic device structure 100. In some embodiments, horizontally neighboring conductive structures of one or more vertically upper tiers of the modified stack structure are employed as upper select gates (e.g., SGDs) of the microelectronic device structure 100. The dielectric liner material 132 (e.g., filling the trench 122 (FIG. 1F)) and the dielectric structure 106 may horizontally intervene between and electrically isolate horizontally neighboring upper select gates (e.g., SGDs) of the microelectronic device structure 100. The dielectric liner material 132 may also horizontally intervene between and electrically isolate conductive structures formed through the replacement of the first dielectric material 108. Accordingly, the dielectric liner material 132 may prevent undesirable current leakage and short circuits between horizontally neighboring upper select gates (e.g., SGDs) of the microelectronic device structure 100 that may otherwise occur if the trenches 122 (FIG. 1F) (and, thus, the dielectric liner material 132) were not formed to partition the first dielectric material 108 and the conductive structures formed to replace the first dielectric material 108.

Thus, in accordance with embodiments of the disclosure, a microelectronic device comprises a stack structure, a filled trench partially vertically extending through the stack structure and horizontally extending in a first direction, and at least one dielectric structure within the filled trench. The stack structure comprises vertically alternating conductive structures and insulating structures arranged in tiers. Each of the tiers comprises one of the conductive structures and one of the insulating structures. The filled trench comprises a lower portion, and an upper portion having a greater horizontal width in a second direction orthogonal to the first direction than the lower portion.

Figure 2A:
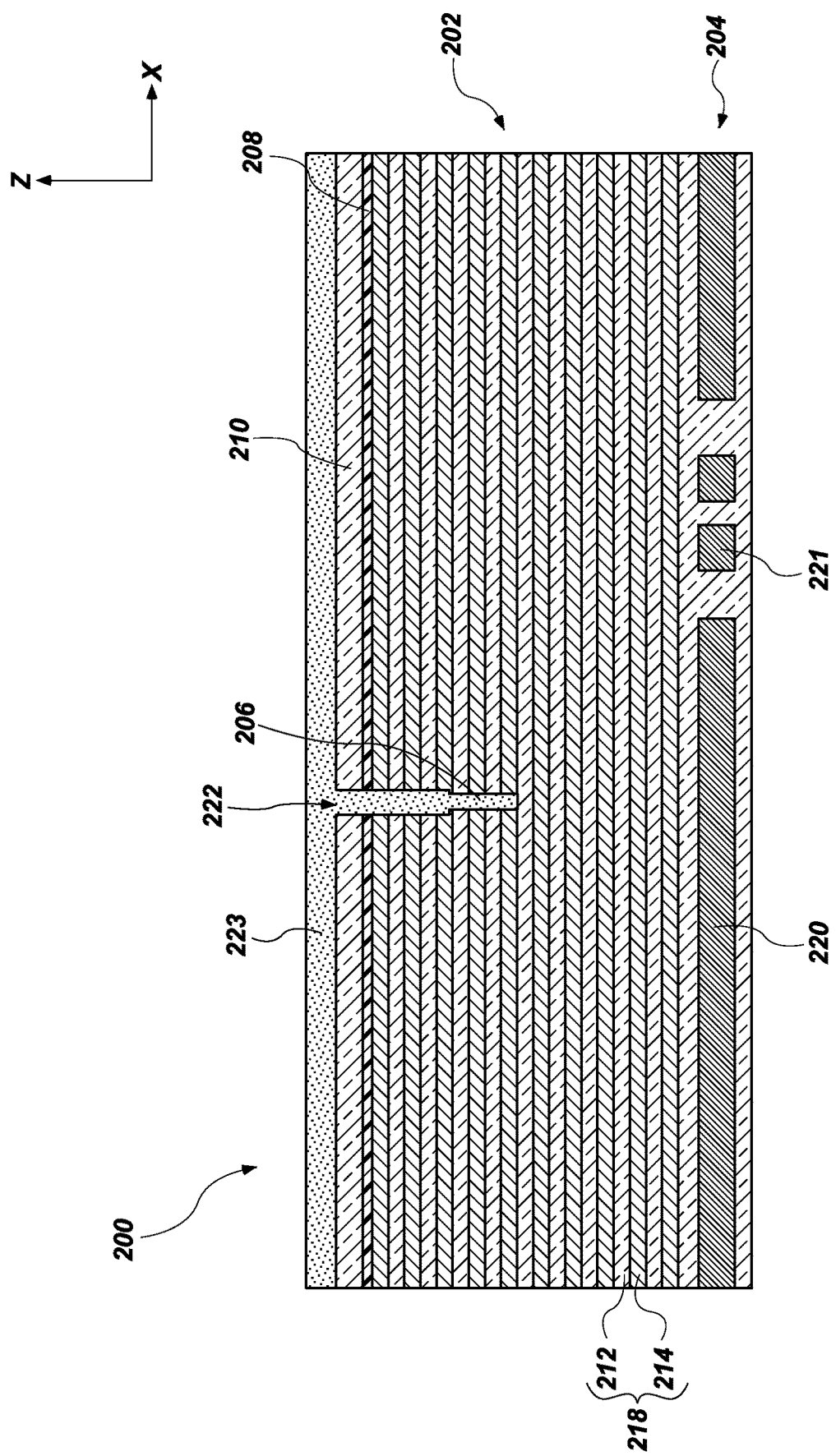
FIGS. 2A through 2C are a simplified, partial cross-sectional views illustrating a method of forming a microelectronic device, in accordance with additional embodiments of the disclosure.
Figure 2B:
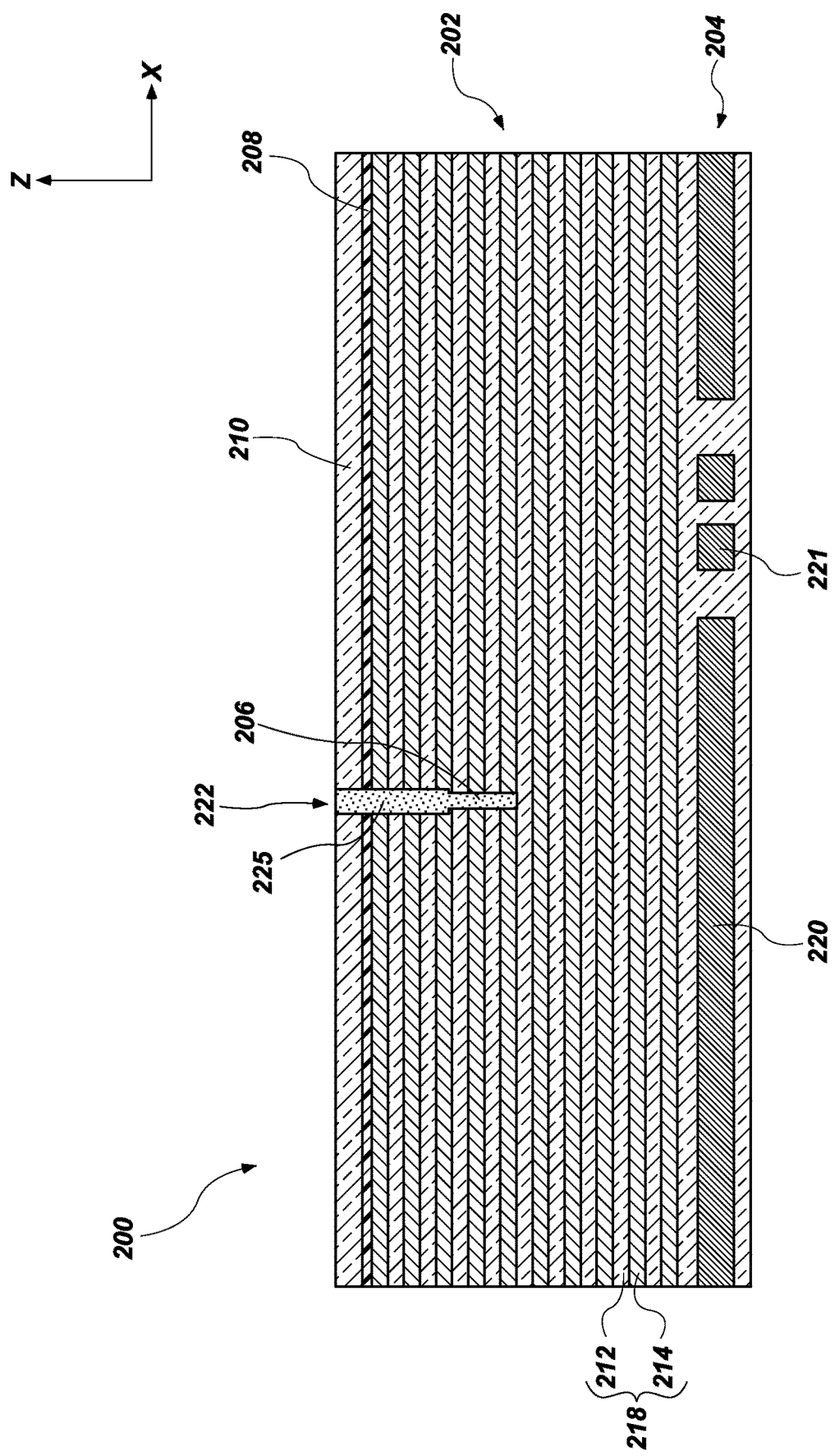
Figure 2C:
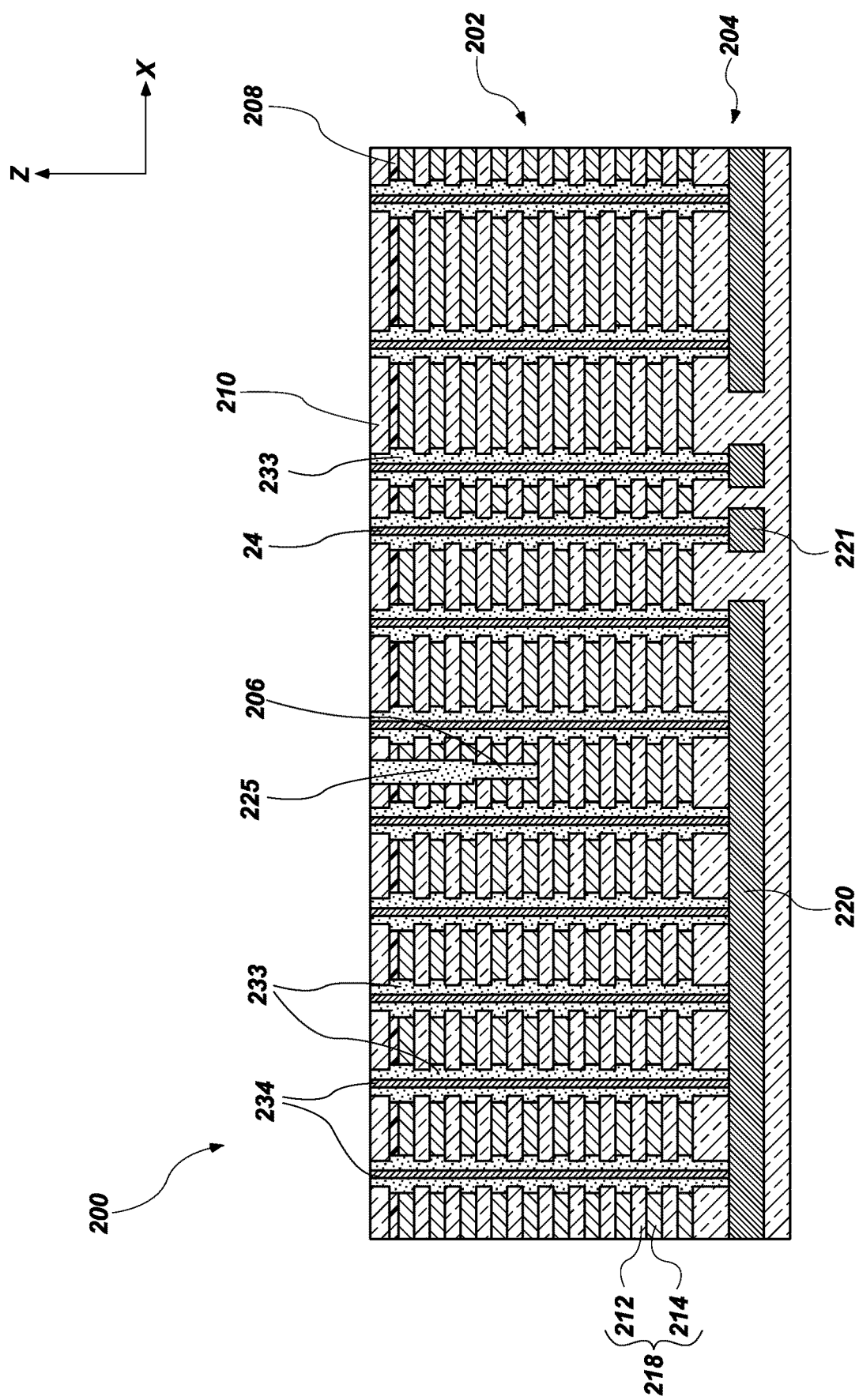

With returned reference to FIG. 1B, in additional embodiments, the trench 122 is substantially filled with dielectric material prior to the formation of the masking structure 124 (FIG. 1C), the contact openings 126 (FIG. 1D), and the dielectric liner material 132 (FIG. 1G). By way of non-limiting example, FIGS. 2A through 2C are simplified partial cross-sectional views illustrating a method of forming a microelectronic device structure 200, in accordance with additional embodiments of the disclosure. The microelectronic device structure 200 may be formed in substantially the same manner as and may exhibit substantially the same features (e.g., structures, materials) as the microelectronic device structure 100 up through the processing stage previously described herein with reference to FIG. 1B. Accordingly, the formation process described below with respect to FIGS. 2A through 2C incorporates the processing stages and features previously described in relation to the formation of the microelectronic device structure 100 up through the processing stage previously described with reference to FIG. 1B. Throughout FIGS. 2A through 2C and the associated description below, features (e.g., structures, materials, regions) functionally similar to features of the microelectronic device structure 100 previously described with reference to FIGS. 1A through 1H are referred to with similar reference numerals incremented by 100. To avoid repetition, not all features shown in FIGS. 2A through 2C are described in detail herein. Rather, unless described otherwise below, in FIGS. 2A through 2C, a feature designated by a reference numeral that is a 100 increment of the reference numeral of a previously described feature (whether the previously described feature is first described before the present paragraph, or is first described after the present paragraph) will be understood to be substantially similar to the previously-described feature.

Referring to FIG. 2A, following the formation of the trench 222, a dielectric fill material 223 may be formed on or over exposed surfaces of the microelectronic device structure 200 inside and outside of the trench 222. The dielectric fill material 223 may cover and substantially extend across surfaces of the stack structure 202, the dielectric structure 206, the first dielectric material 208, and the second dielectric material 210 defining horizontal boundaries and lower vertical boundaries of the trench 222. The dielectric fill material 223 may also substantially fill the trench 222. In addition, the dielectric fill material 223 may cover and substantially extend across surfaces of the second dielectric material 210 outside of the boundaries of the trench 222.

The dielectric fill material 223 may be formed of and include at least one dielectric material. The materials of first dielectric material 208 and the additional insulative structures 214 of the stack structure 202 may be selectively etchable relative to the dielectric fill material 223. A material composition of the dielectric fill material 223 is different than material compositions of the first dielectric material 208 and the additional insulative structures 214, and may comprise one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the dielectric fill material 223 is formed of and includes $AlO_x$ (e.g., $Al_2O_3$). The dielectric fill material 223 may include a substantially homogeneous distribution of the dielectric material, or a substantially heterogeneous distribution of the dielectric material. In some embodiments, the dielectric fill material 223 exhibits a substantially homogeneous distribution of dielectric material. In additional embodiments, the dielectric fill material 223 exhibits a substantially heterogeneous distribution of dielectric material. The dielectric fill material 223 may, for example, be formed of and include a stack (e.g., laminate) of at least two different dielectric materials.

Referring next to FIG. 2B, portions of the dielectric fill material 223 (FIG. 2A) outside of the boundaries of the trench 222 may be selectively removed. The material removal process may expose (e.g., uncover) upper surfaces of the second dielectric material 210, and may form a dielectric fill structure 225 substantially confined within the boundaries (e.g., vertical boundaries, horizontal boundaries) of the trench 222. The portions of the dielectric fill material 223 (FIG. 2A) outside of the boundaries of the trench 222 may be removed using conventional processes (e.g., a conventional CMP process) and conventional processing equipment, which are not described in detail herein.

Referring next to FIG. 2C, following the formation of the dielectric fill structure 225, the microelectronic device structure 200 may be subjected to a sequence of additional processing acts to form dielectric liner structures 233 and contact structures 234. The sequence of additional processing acts may be substantially similar to the sequence of processing acts previously described with reference to FIGS. 1C through 1H. However, since trench 222 is already filled with the dielectric fill structure 225, an enlarged trench (e.g., corresponding the enlarged trench 130 previously described with reference to FIG. 1F) having non-planar sidewalls effectuated by selective horizontal recessing of the additional insulative structures 214 and the first dielectric material 208 is not formed. Rather, while enlarged contact openings (e.g., corresponding to the enlarged contact openings 128 previously described with reference to FIG. 1F) having non-planar sidewalls effectuated by horizontal recessing of the additional insulative structures 214 and the first dielectric material 208 are formed, the dielectric fill structure 225 protects the portions of the additional insulative structures 214 and the first dielectric material 208 horizontally adjacent thereto from such horizontal recessing. Accordingly, the substantially planar horizontal boundaries of the trench 222 (and, hence, of the dielectric fill structure 225 filling the trench 222) may be substantially maintained during and after the sequent processing of the microelectronic device structure 200 to form the dielectric liner structures 233 and the contact structures 234.

Following the formation of the contact structures 234, the microelectronic device structure 200 may be subjected to additional processing in a manner substantially similar to that previously described with respect to the microelectronic device structure 100 after the processing stage depicted in FIG. 1H. For example, slots (e.g., slits, trenches) may be formed to vertically extend through the second dielectric material 210, the first dielectric material 208, and the stack structure 202 to form discrete blocks. Thereafter, portions of the first dielectric material 208 and the additional insulative structures 214 of the stack structure 202 may be selectively removed (e.g., selectively etched and exhumed) through the slots, and replaced with conductive structures each individually comprising at least one electrically conductive material (e.g., W) through a so-called "replace gate" or "gate last" process. The dielectric fill structure 225 (e.g., filling the trench 222 (FIG. 2C)) and the dielectric structure 206 may horizontally intervene between and electrically isolate horizontally neighboring upper select gates (e.g., SGDs) of the microelectronic device structure 200. The dielectric fill structure 225 may also horizontally intervene between and electrically isolate conductive structures formed through the replacement of the first dielectric material 208. Accordingly, the dielectric fill structure 225 may prevent undesirable current leakage and shorting between horizontally neighboring upper select gates (e.g., SGDs) of the microelectronic device structure 200 that may otherwise occur if the trenches 222 (FIG. 2C) (and, thus, the dielectric fill structure 225) were not formed to partition the first dielectric material 208 and the conductive structures formed to replace the first dielectric material 208.

Figure 3A:
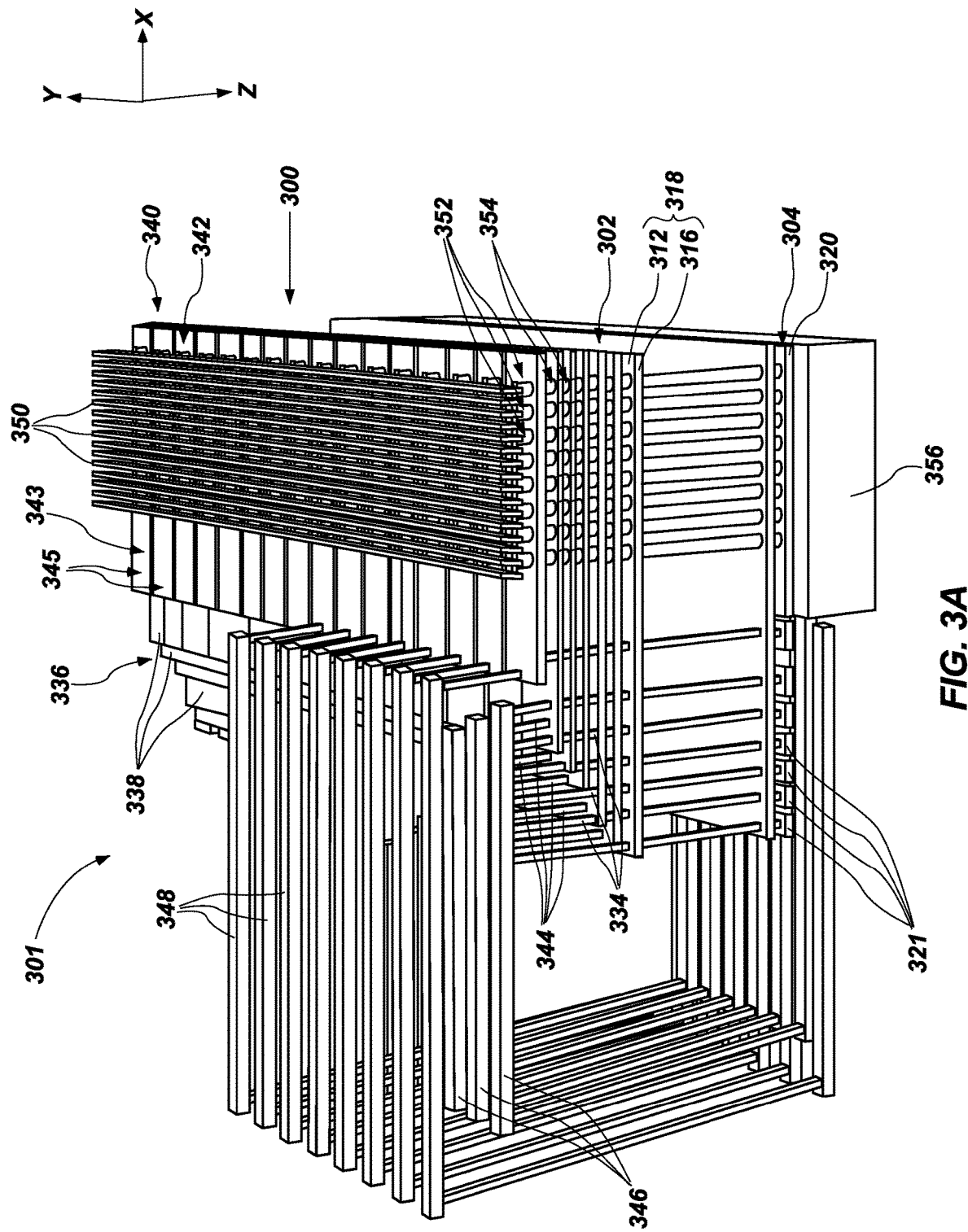
FIG. 3A is a partial cutaway perspective view of a microelectronic device, in accordance with embodiments of the disclosure.

FIG. 3A illustrates a partial cutaway perspective view of a portion of a microelectronic device 301 (e.g., a memory device, such as a dual deck 3D NAND Flash memory device) including a microelectronic device structure 300. The microelectronic device structure 300 may comprise one of the microelectronic device structures 100, 200 previously described herein following additional processing after the processing stages depicted in FIGS. 1H and 2C, respectively. As shown in FIG. 3A, the microelectronic device structure 300 may include a stack structure 302 including tiers 318 of vertically alternating (e.g., in the Z-direction) conductive structures 316 (formed through replacement of the additional insulative structures 114, 214 and the first dielectric materials 108, 208 previously described within reference to FIGS. 1H and 2C) and insulative structures 312 (e.g., corresponding to the insulative structures 112, 212 previously described with reference to FIGS. 1A through 1H and 2A through 2C), and horizontally divided (e.g., in the Y-direction) into multiple blocks 340 horizontally separated (e.g., in the Y-direction) from one another by filled slots 342 (e.g., slots filled with dielectric material); additional filled slots 343 (e.g., individually corresponding to the enlarged trench 130 filled with the dielectric liner material 132 previously described with reference to FIGS. 1F through 1H, or the trench 222 filled with the dielectric fill structure 225 previously described with reference to FIGS. 2B and 2C) partially vertically extending (e.g., in the Z-direction) into each of the blocks 340 (and defining upper select gates, such as SGDs, of each of the blocks 340) and sub-dividing each of the blocks 340 into at least two sub-blocks 345; staircase structures 336 having steps 338 defined by edges (e.g., horizontal ends in the X-direction) of the tiers 318; contact structures 334 (e.g., corresponding to the contact structures 134, 234 previously described with reference to FIGS. 1H and 2C, respectively) vertically extending through the stack structure 302; additional contact structures 344 (e.g., access line contact structures, word line contact structures) connected to the steps 338 of the staircase structures 336; and a source tier 304 including a source structure 320 (e.g., corresponding to one of the source structures 120, 220 previously described with reference to FIGS. 1A through 1H and 2A through 2H, respectively) and discrete conductive structures 321 (e.g., corresponding to one of the discrete conductive structures 121, 221 previously described with reference to FIGS. 1A through 1H and 2A through 2H, respectively) contacting (e.g., physically contacting and/or electrically contacting) the contact structures 334. The microelectronic device 301 also includes additional features (e.g., structures, devices) operatively associated with the microelectronic device structure 300, as described in further detail below.

Figure 3B:
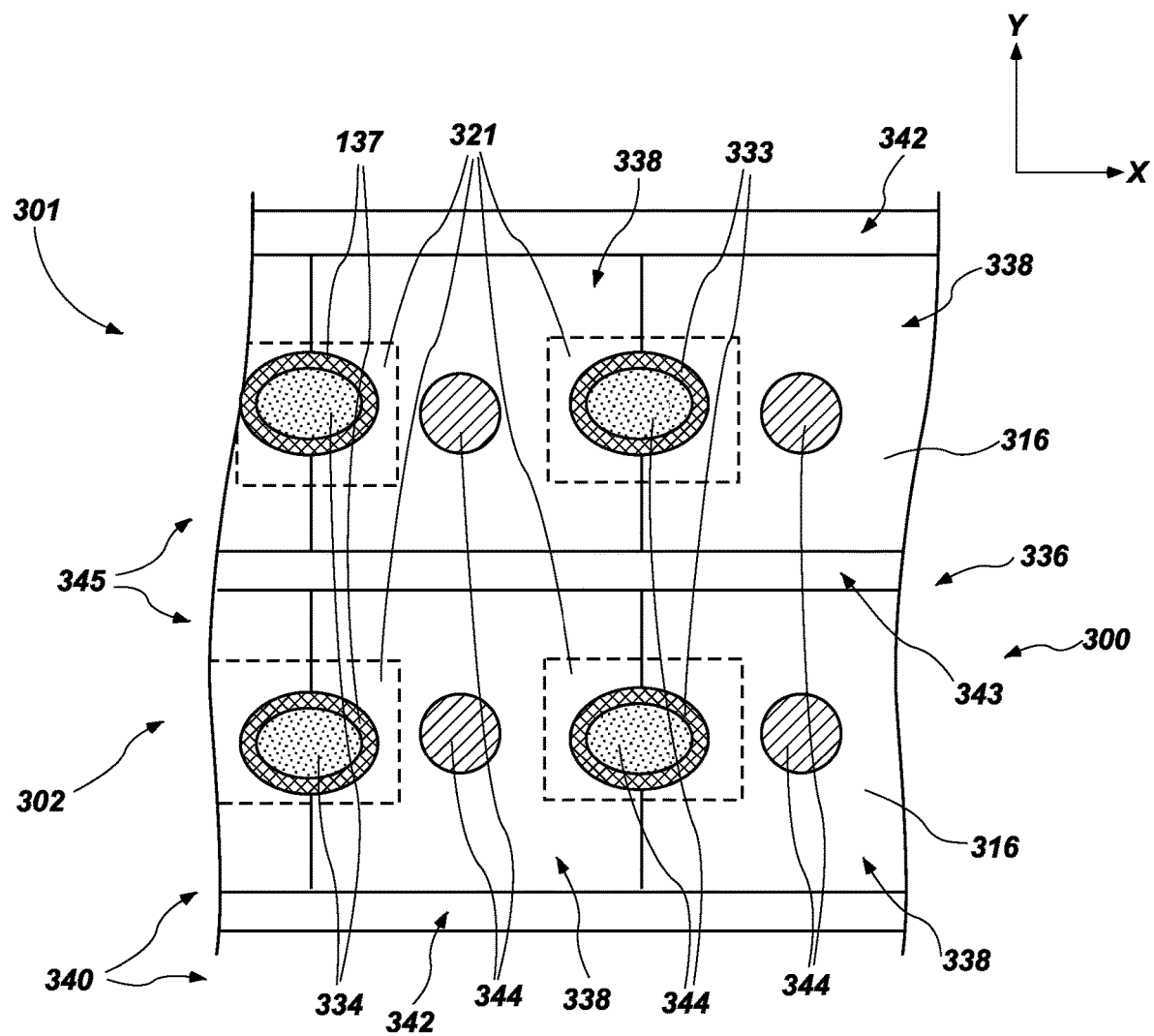
FIG. 3B is a partial top-down view of a portion of the microelectronic device shown in FIG. 3A.

FIG. 3B is a simplified top-down view of a portion of the microelectronic device 301 shown in FIG. 3A about an upper section of a staircase structure 336 thereof. For clarity and ease of understanding of the drawings and related description, not all features (e.g., structures, materials, regions) of the microelectronic device 301 depicted in one of FIGS. 3A and 3B are depicted the other of FIGS. 3A and 3B. For example, some features of the microelectronic device 301 vertically overlying or vertically underlying other features of the microelectronic device 301 are not shown in FIG. 3B so as to provide a clearer view of the other features.

Referring to FIG. 3B, the additional contact structures 344 (e.g., access line contact structures, word line contact structures) physically and electrically contact the steps 338 of the staircase structure 336 to provide electrical access to the conductive structures 316 of the tiers 318 (FIG. 3A) of the stack structure 302. The additional contact structures 344 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the additional contact structures 344 may have substantially the same material composition, or at least one of the additional contact structures 344 may have a different material composition than at least one other of the additional contact structures 344.

The additional contact structures 344 may each individually be provided at a desired horizontal location (e.g., in the X-direction and the Y-direction) on or over one of the steps 338 of the microelectronic device structure 300. As shown in FIG. 3B, in some embodiments, each of the additional contact structures 344 is individually substantially horizontally centered on one of the steps 338 of the microelectronic device structure 300. For example, for each block 340 of the microelectronic device structure 300, the additional contact structures 344 associated with (e.g., within horizontal boundaries of) the block 340 may be substantially horizontally centered in the X-direction and the Y-direction on the steps 338 of the block 340. In additional embodiments, one or more of the additional contact structures 344 are individually horizontally offset (e.g., in the X-direction and/or in the Y-direction) from horizontal center the step 338 associated therewith. For example, for one or more of the blocks 340 of the microelectronic device structure 300, at least one (e.g., all, less than all) of the additional contact structures 344 associated with the block 340 may be horizontally offset in the Y-direction from a horizontal center of the step 338 on which the additional contact structure 344 is located. As another example, for one or more of the blocks 340 of the microelectronic device structure 300, at least one (e.g., all, less than all) of the additional contact structures 344 associated with the block 340 may be horizontally offset in the X-direction from a horizontal center of the step 338 on which the additional contact structure 344 is located. In addition, at least some of the additional contact structures 344 on the steps 338 of the staircase structure 336 may be horizontally-aligned with one another. For example, at least some (e.g., all) additional contact structures 344 horizontally-neighboring one another in the X-direction (and, hence, on steps 338 at different vertical positions than one another) may be substantially aligned with one another in the Y-direction. As another example, at least some (e.g., all) additional contact structures 344 horizontally-neighboring one another in the Y-direction (and, hence, on steps 338 at substantially the same vertical position as one another) may be substantially aligned with one another in the X-direction.

The additional contact structures 344 may each individually exhibit a desired horizontal cross-sectional shape. As shown in FIG. 3B, in some embodiments, each of the additional contact structures 344 exhibits a substantially circular horizontal cross-sectional shape. In additional embodiments, one or more (e.g., each) of the additional contact structures 344 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the additional contact structures 344 may exhibit substantially the same horizontal cross-sectional dimensions (e.g., substantially the same horizontal diameter), or at least one of the additional contact structures 344 may exhibit one or more different horizontal cross-sectional dimensions (e.g., a different horizontal diameter) than at least one other of the additional contact structures 344. In some embodiments, all of the additional contact structures 344 exhibit substantially the same horizontal cross-sectional dimensions.

With continued reference to FIG. 3B, some of the contact structures 334 associated with (e.g., within horizontal boundaries of) individual blocks 340 of the microelectronic device structure 300 may horizontally alternate with and be spaced apart from the additional contact structures 344 associated with the block 340 in the X-direction. The contact structures 334 associated with the same block 340 as one another are at least partially horizontally offset (e.g., in the Y-direction) from the additional contact structures 344 associated with block 340. For example, as shown in FIG. 3B, horizontal centers of at least some contact structures 334 associated with (e.g., within horizontal boundaries of) the same block 340 as one another are offset from (e.g., unaligned with) horizontal centers in the Y-direction of at least some of the additional contact structures 344 associated with the block 340. The horizontal centers of the contact structures 334 may be located relatively more proximate the filled slots 342 horizontally neighboring the block 340, and may be located relatively more distal from the additional filled slot 343 dividing the block 340 into the sub-blocks 345. The horizontal centers of the contact structures 334 may also be offset from horizontal centers in the Y-direction of the discrete conductive structures 321 of the source tier 304 (FIG. 3A) in contact with the contact structures 334. In additional embodiments, horizontal centers of at least some contact structures 334 associated with the same block 340 as one another are substantially aligned in the Y-direction with at least some of the additional contact structures 344 associated with the block 340, and/or are substantially aligned with horizontal centers in the Y-direction of the discrete conductive structures 321 of the source tier 304 (FIG. 3A) in contact with the contact structures 334.

As shown in FIG. 3B, at least some of the contact structures 334 may each individually exhibit an oblong horizontal cross-sectional shape, such as a generally ovular horizontal cross-sectional shape. Dielectric liner structures 333 (e.g., corresponding to the dielectric liner structures 133, 233 previously described with reference to FIGS. 1H and 2C, respectively) horizontally surrounding the contact structures 334 may also exhibit an oblong peripheral horizontal cross-sectional shape (e.g., a generally ovular peripheral horizontal cross-sectional shape). A horizontal dimension of the contact structures 334 (and the dielectric liner structures 333) in the X-direction may be less than another horizontal dimension of the contact structures 334 in the Y-direction. The oblong horizontal cross-sectional shape of the contact structures 334 may facilitate relatively greater distances in the Y-direction between the contact structures 334 and the additional filled slot 343 dividing the block 340 into the sub-blocks 345 as compared to other horizontal cross-sectional shapes (e.g., circular horizontal cross-sectional shapes). In additional embodiments, one or more of the contact structures 334 exhibits a different horizontal cross-sectional shape, such as one more of an different oblong cross-sectional shape, a circular cross-sectional shape, an elliptical cross-sectional shape, a square cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. Each of the contact structures 334 may exhibit substantially the same horizontal cross-sectional shape and substantially the same cross-sectional dimensions, or at least one of the contact structures 334 may exhibit a different horizontal cross-sectional shape and/or one or more different horizontal cross-sectional dimensions than at least one other of the contact structures 334. In some embodiments, all of the contact structures 334 exhibit substantially the same horizontal cross-sectional shape and substantially the same horizontal cross-sectional dimensions.

With returned reference to FIG. 3A, the microelectronic device 301 may further include strings 352 of memory cells 354 vertically coupled to one another in series, access lines 346 (e.g., word lines), select lines 348, and data lines 350 (e.g., bit lines). The strings 352 of the memory cells 354 extend vertically and orthogonal to conductive lines and tiers (e.g., the source tier 304, the tiers 318 of the stack structure 302, the access lines 346, the select lines 348, the data lines 350) of the microelectronic device 301, and the additional contact structures 344 may electrically couple components to each other as shown (e.g., the access lines 346 and the select lines 348 to the tiers 318 of the stack structure 302 of the microelectronic device structure 300).

With continued reference to FIG. 3A, the microelectronic device 301 may also include a control unit 356 (e.g., a control device) positioned vertically below the strings 352 of memory cells 354, which may include one or more of string driver circuitry, pass gates, circuitry for selecting gates, circuitry for selecting conductive lines (e.g., the access lines 346, the select lines 348, the data lines 350, additional access lines, additional select lines, additional data lines), circuitry for amplifying signals, and circuitry for sensing signals. In some embodiments, the control unit 356 is at least partially (e.g., substantially) positioned within horizontal boundaries (e.g., in the X-direction and the Y-direction) of a horizontal area occupied by the strings 352 of memory cells 354. The control unit 356 may, for example, be electrically coupled to the data lines 350, the source structure 320 of the source tier 304, the access lines 346, and select lines 348. In some embodiments, the control unit 356 includes CMOS (complementary metal-oxide-semiconductor) circuitry. In such embodiments, the control unit 356 may be characterized as having a "CMOS under Array" ("CuA") configuration.

Thus, in accordance with embodiments of the disclosure, a memory device comprises a stack structure, dielectric-filled trenches partially vertically extending through the stack structure, a staircase structure, a source tier, pillar structures, access line contact structures, data lines, an array of vertically extending strings of memory cells, access lines, and a control device. The stack structure comprises tiers each comprising at least one conductive structure and at least one insulating structure vertically adjacent the at least one conductive structure. The dielectric-filled trenches each comprise a lower portion, and an upper portion having one or more greater horizontal widths than the lower portion. The staircase structure has steps comprising edges of the tiers of the stack structure. The source tier underlies the stack structure and comprises a source plate, and discrete conductive structures separated from one another and the source plate. The pillar structures vertically extend through the stack structure and contact the discrete conductive structures of the source tier. The access line contact structures are on the steps of the staircase structure and horizontally alternate with some of the pillar structures. The data lines overlie the stack structure. The array of vertically extending strings of memory cells extends through the stack structure and is electrically connected to the source plate and the data lines. The access lines are electrically connected to the access line contact structures. The control device comprises CMOS circuitry vertically underlying the source tier and within horizontal boundaries of the array of vertically extending strings of memory cells. The control device is electrically coupled to the source plate, the data lines, and the access lines.

Figure 4:
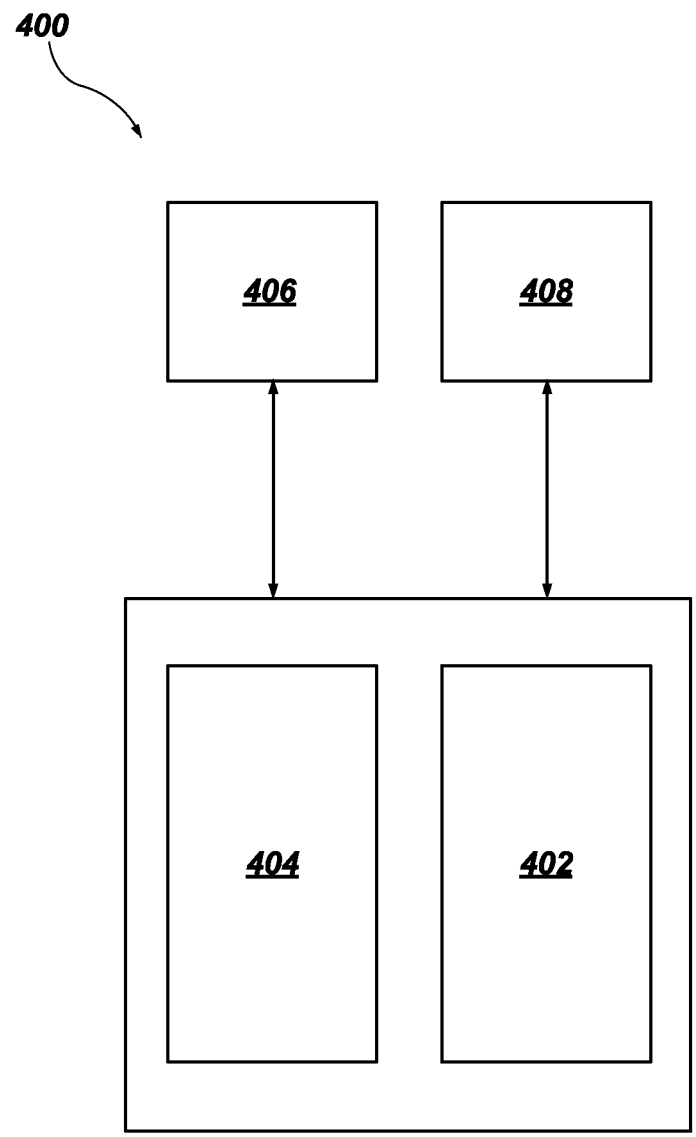
FIG. 4 is a schematic block diagram illustrating an electronic system, in accordance with embodiments of the disclosure.

Microelectronic device structures (e.g., the microelectronic device structure 300 previously described with reference to FIGS. 3A and 3B) and microelectronic devices (e.g., the microelectronic device 301 previously described with reference to FIGS. 3A and 3B) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure and a microelectronic device previously described herein. The electronic system 400 may further include at least one electronic signal processor device 404 (often referred to as a "microprocessor"). The electronic signal processor device 404 may, optionally, include an embodiment of one or more of a microelectronic device structure and a microelectronic device previously described herein. While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure and a microelectronic device previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising tiers each comprising a conductive structure and a dielectric structure vertically neighboring the conductive structure; trenches vertically extending completely through the stack structure and filled with dielectric material; additional trenches horizontally alternating with the trenches and vertically extending partially through the stack structure, at least one of the additional trenches having non-planar horizontal boundaries and filled with additional dielectric material; a source tier vertically below the stack structure and comprising a source structure and discrete conductive structures electrically isolated from one another and the source structure; and conductive pillars vertically extending through the stack structure to the discrete conductive structures of the source tier.

The methods, structures (e.g., the microelectronic device structures 100, 200, 300), devices (e.g., the microelectronic device 301), and systems (e.g., the electronic system 400) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the methods and configurations of the disclosure may reduce the risk undesirable current leakage and short circuits (e.g., SGD-SGD current leakage and short circuits) as compared to conventional methods and configurations.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
   a stack structure comprising vertically alternating conductive structures and insulating structures arranged in tiers, each of the tiers comprising one of the conductive structures and one of the insulating structures;
   a trench partially vertically extending through the stack structure and horizontally extending in a first direction, the trench comprising:
      a lower portion; and
      an upper portion comprising substantially non-planar horizontal boundaries, the upper portion having at least one a greater horizontal width in a second direction orthogonal to the first direction than the lower portion; and
   at least one dielectric structure within and substantially completely filling the trench.

2. The microelectronic device of claim 1, wherein horizontal boundaries of the lower portion of the filled trench are substantially planar.

3. A microelectronic device, comprising:
   a stack structure comprising vertically alternating conductive structures and insulating structures arranged in tiers, each of the tiers comprising one of the conductive structures and one of the insulating structures;
   a filled trench partially vertically extending through the stack structure and horizontally extending in a first direction, the filled trench comprising:
      a lower portion; and
      an upper portion having a greater horizontal width in a second direction orthogonal to the first direction than the lower portion;
   at least one dielectric structure within the filled trench;
   a source tier underlying the stack structure and comprising:
      a conductive source structure; and
      discrete conductive structures horizontally separated from one another and the conductive source structure;
   contact structures vertically extending completely through the stack structure to the discrete conductive structures of the source tier; and
   dielectric liner structures horizontally intervening between the contact structures and the stack structure.

4. The microelectronic device of claim 3, wherein:
   the contact structures have ovular horizontal cross-sectional shapes; and
   horizontal centers of at least some of the contact structures are offset from horizontal centers of at least some of the discrete conductive structures physically contacting the at least some of the contact structures.

5. The microelectronic device of claim 3, further comprising:
   a staircase structure having steps comprising edges of at least some of the tiers of the stack structure; and
   additional contact structures on the steps of the staircase structure and horizontally alternating with at least some of the contact structures in the first direction.

6. The microelectronic device of claim 1, wherein the upper portion of the trench comprises:
   first sub-portions horizontally neighboring and substantially confined within vertical boundaries of the insulating structures; and
   second sub-portions horizontally neighboring and substantially confined within vertical boundaries of the conductive structures, the second sub-portions having greater horizontal widths than the first sub-portions.

7. The microelectronic device of claim 6, wherein a horizontal width of each of the first sub-portions of the upper portion of the trench is substantially equal to a horizontal width of the lower portion of the trench.

8. The microelectronic device of claim 6, wherein a horizontal width of at least one of the second sub-portions of the upper portion of the trench is substantially equal to that of at least one other of the second sub-portions of the upper portion of the trench.

9. The microelectronic device of claim 1, wherein the at least one dielectric structure consists of only one dielectric material, the dielectric material substantially completely filling the trench.

10. The microelectronic device of claim 1, wherein the at least one dielectric structure comprises aluminum oxide.

11. The microelectronic device of claim 1, wherein an upper surface of the least one dielectric structure is substantially planar.

12. The microelectronic device of claim 11, wherein the upper surface of the least one dielectric structure vertically overlies an uppermost surface of the stack structure.

* * * * *

UNITED STATES PATENT AND TRADEMARK OFFICE
CERTIFICATE OF CORRECTION

PATENT NO. : 11,309,328 B2
APPLICATION NO. : 16/667719
DATED : April 19, 2022
INVENTOR(S) : Shuangqiang Luo, Indra V. Chary and Justin B. Dorhout It is certified that error appears in the above-identified patent and that said Letters Patent is hereby corrected as shown below:

In the Specification

| | | |
|---|---|---|
| Column 1, | Line 67, | change "configurations and have" to --configurations have-- |
| Column 3, | Line 42, | change "(e.g." to --(e.g.,-- |
| Column 5, | Line 3, | change "such one" to --such as one-- |
| Column 5, | Line 31, | change "Sift)." to --$SiO_2$).-- |
| Column 7, | Line 9, | change "such drain side" to --such as drain side-- |
| Column 8, | Line 45, | change "Sift)." to --$SiO_2$).-- |
| Column 9, | Line 33, | change "is a second" to --in a second-- |
| Column 9, | Line 42, | change "greater about" to --greater to about-- |
| Column 14, | Line 28, | change "formed form" to --formed from-- |
| Column 19, | Line 23, | change "center the step" to --center of the step-- |
| Column 19, | Line 55, | change "one more" to --one or more-- |
| Column 20, | Line 58, | change "one more" to --one or more-- |

In the Claims

| | | | |
|---|---|---|---|
| Claim 1, | Column 23, | Line 43, | change "one a greater" to --one greater-- |

Signed and Sealed this
Thirtieth Day of August, 2022

Katherine Kelly Vidal
*Director of the United States Patent and Trademark Office*